(12) United States Patent
Cottuli et al.

(10) Patent No.: US 8,627,611 B2
(45) Date of Patent: Jan. 14, 2014

(54) AISLE ENCLOSURE SYSTEM

(76) Inventors: Carl Cottuli, Franklin, MA (US);
Manuel D. Linhares, Jr., Coventry, RI (US)

( * ) Notice: Subject to any disclaimer, the term of this patent is extended or adjusted under 35 U.S.C. 154(b) by 446 days.

(21) Appl. No.: 13/102,494

(22) Filed: May 6, 2011

(65) Prior Publication Data

US 2011/0271610 A1    Nov. 10, 2011

Related U.S. Application Data

(60) Provisional application No. 61/331,874, filed on May 6, 2010.

(51) Int. Cl.
*E04H 1/00* (2006.01)

(52) U.S. Cl.
USPC ............... 52/36.2; 52/79.1; 52/64; 52/36.4; 52/243.1; 312/198

(58) Field of Classification Search
USPC ............ 52/36.2, 36.4, 36.5, 39, 243.1, 239, 52/238.1, 79.1, 64, 174; 361/688; 312/198
See application file for complete search history.

(56) References Cited

U.S. PATENT DOCUMENTS

| | | | | |
|---|---|---|---|---|
| 1,875,832 A | * | 9/1932 | Swanson | 52/39 |
| 1,921,106 A | * | 8/1933 | Swanson | 52/39 |
| 2,376,279 A | | 5/1945 | Schlenkert | |
| 3,004,636 A | * | 10/1961 | Morris | 52/239 |
| 5,325,641 A | * | 7/1994 | Felton | 52/36.4 |
| 5,906,080 A | * | 5/1999 | diGirolamo et al. | 52/243.1 |
| 6,131,361 A | | 10/2000 | Murphy | |
| 6,148,571 A | * | 11/2000 | Seyller | 52/200 |
| 6,550,203 B1 | * | 4/2003 | Little | 52/407.4 |
| 6,612,087 B2 | * | 9/2003 | diGirolamo et al. | 52/712 |
| 7,104,024 B1 | * | 9/2006 | diGirolamo et al. | 52/710 |
| 7,478,508 B2 | * | 1/2009 | Peterson | 52/573.1 |
| 8,180,495 B1 | * | 5/2012 | Roy | 700/278 |

(Continued)

FOREIGN PATENT DOCUMENTS

| | | | | |
|---|---|---|---|---|
| EP | | 127545 A2 * | 12/1984 | E04B 5/62 |
| WO | WO 2009/059649 A1 | | 5/2009 | |

OTHER PUBLICATIONS

International Search Report and Written Opinion of the International Searching Authority issued in PCT/US11/35558, mailed Aug. 17, 2011.

(Continued)

*Primary Examiner* — Robert Canfield
*Assistant Examiner* — Matthew Gitlin
(74) *Attorney, Agent, or Firm* — Mirick, O'Connell, DeMallie & Lougee, LLP

(57) ABSTRACT

An aisle enclosure system including ceiling bracket assemblies, ceiling panels, vertical blanking panels, aisle duct adaptors, and accessory rails, for use with equipment racks and ceiling structures in hot-aisle and cold-aisle data centers. The ceiling assemblies may be mounted to the tops of the racks or may be suspended from an area above the racks. The aisle enclosure system further includes a moveable structure that is configured and adapted to position a ceiling panel in an closed position when the moveable structure is in a first position, and position the ceiling panel in an open position when the moveable structure is in a second position, where the moveable structure is configured and adapted to move from the first position to a second position in response to an alarm condition.

20 Claims, 30 Drawing Sheets

(56) References Cited

U.S. PATENT DOCUMENTS

| | | | |
|---|---|---|---|
| 8,181,419 B1* | 5/2012 | diGirolamo | 52/745.19 |
| 8,215,075 B2* | 7/2012 | Bergman | 52/506.07 |
| 2004/0065036 A1* | 4/2004 | Capozzo | 52/506.03 |
| 2006/0144001 A1* | 7/2006 | Capozzo | 52/506.01 |
| 2006/0260338 A1 | 11/2006 | VanGilder et al. | |
| 2007/0064389 A1 | 3/2007 | Lewis, II et al. | |
| 2008/0305733 A1 | 12/2008 | Noteboom et al. | |
| 2009/0046427 A1 | 2/2009 | Noteboom et al. | |
| 2009/0107652 A1 | 4/2009 | VanGilder et al. | |
| 2009/0129016 A1 | 5/2009 | Hoeft et al. | |
| 2009/0168345 A1 | 7/2009 | Martini | |
| 2009/0255190 A1 | 10/2009 | Kennedy | |
| 2009/0277605 A1 | 11/2009 | VanGilder et al. | |
| 2010/0061057 A1 | 3/2010 | Dersch et al. | |
| 2010/0144265 A1* | 6/2010 | Bednarcik et al. | 454/184 |

OTHER PUBLICATIONS

International Preliminary Report on Patentability issued in PCT/US2011/035558 mailed Nov. 15, 2012.

* cited by examiner

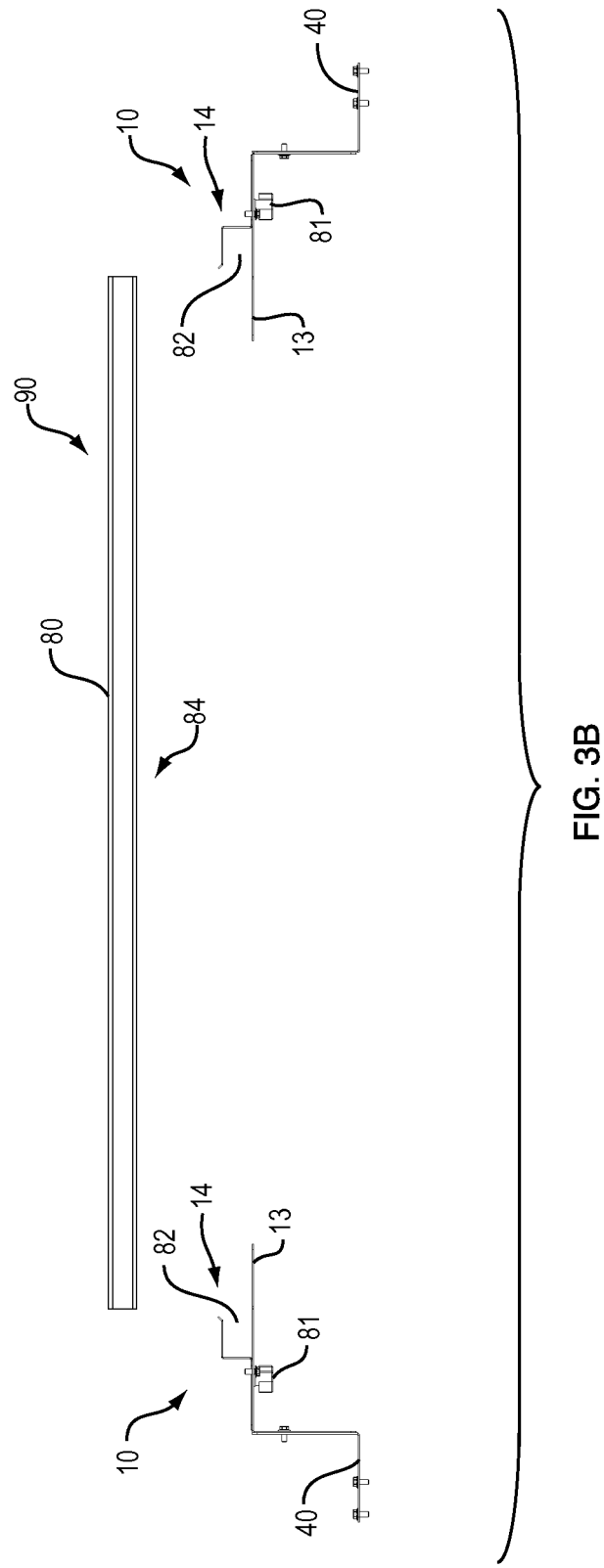

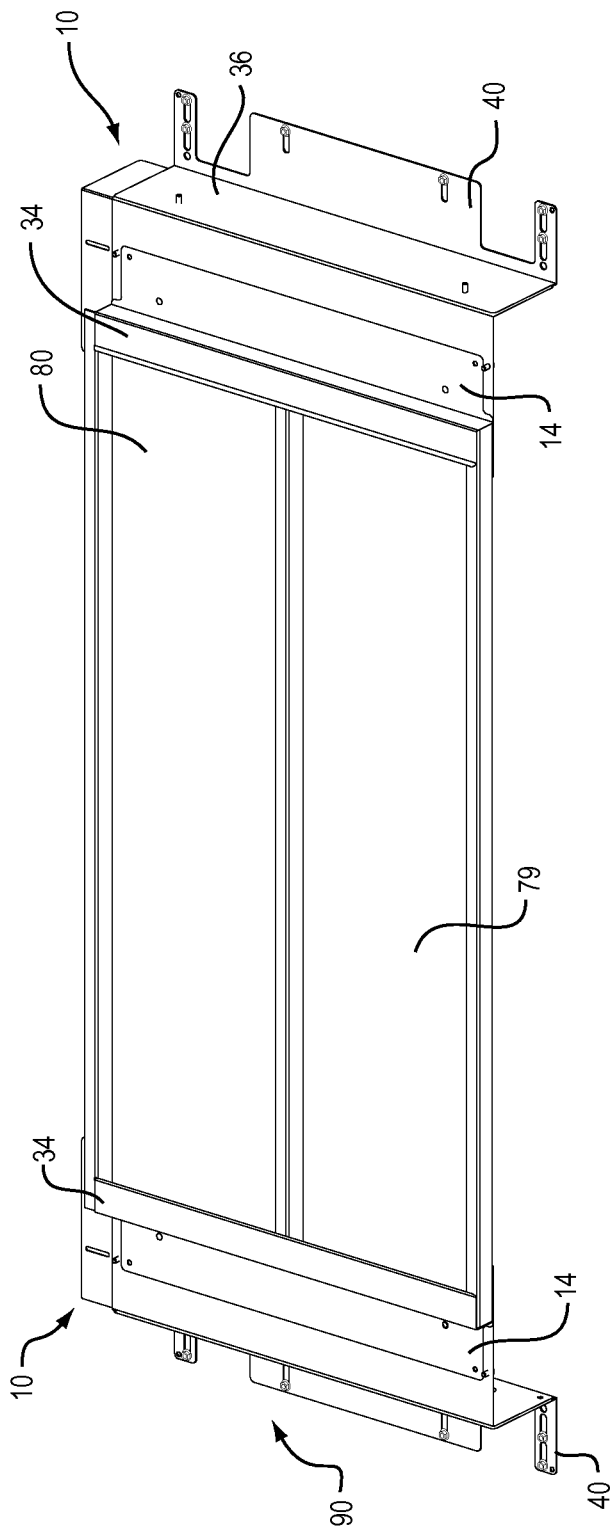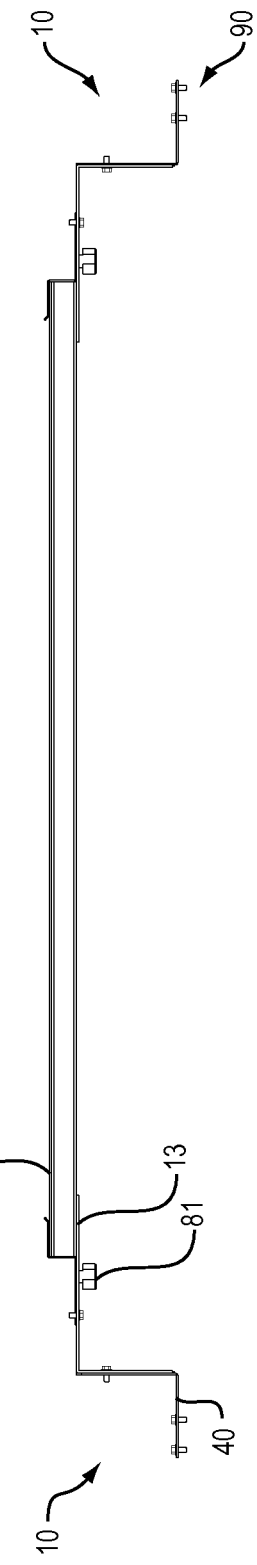
FIG. 4A
FIG. 4B

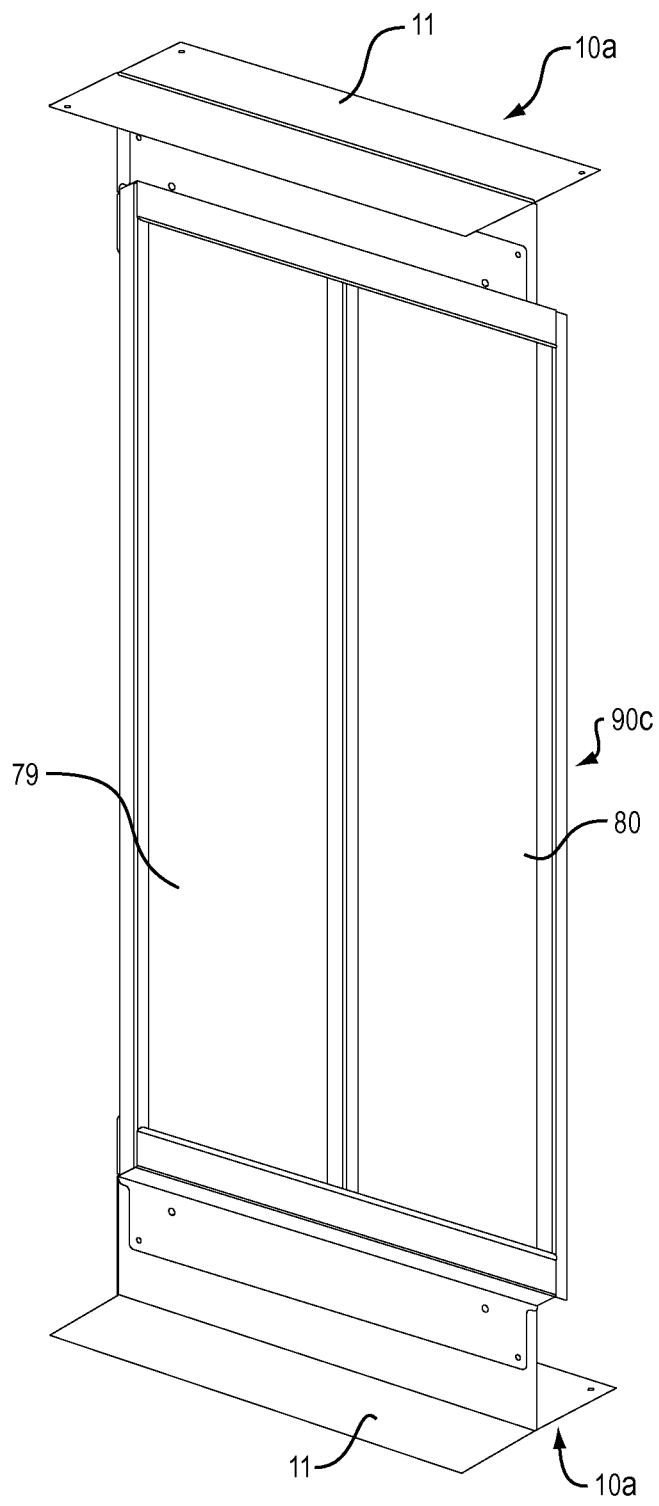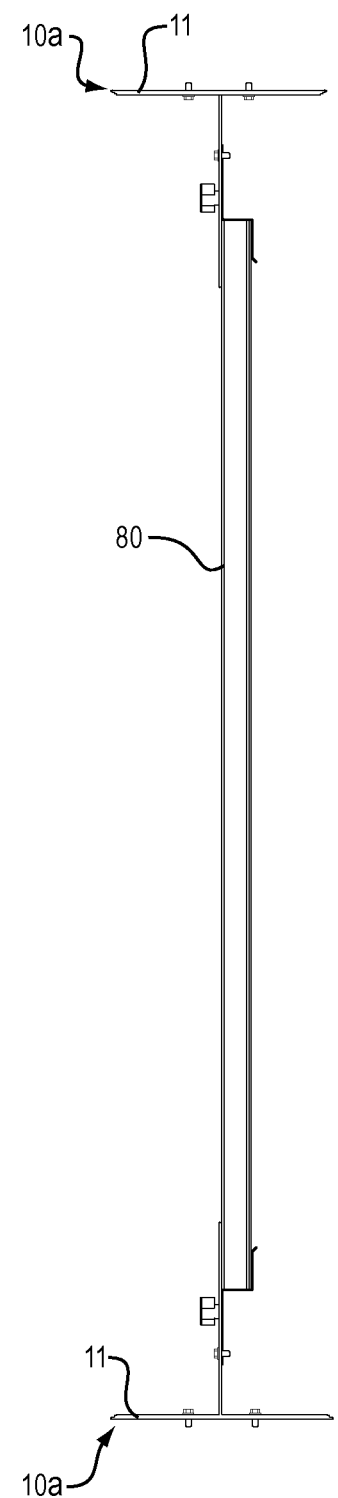
FIG. 5A
FIG. 5B

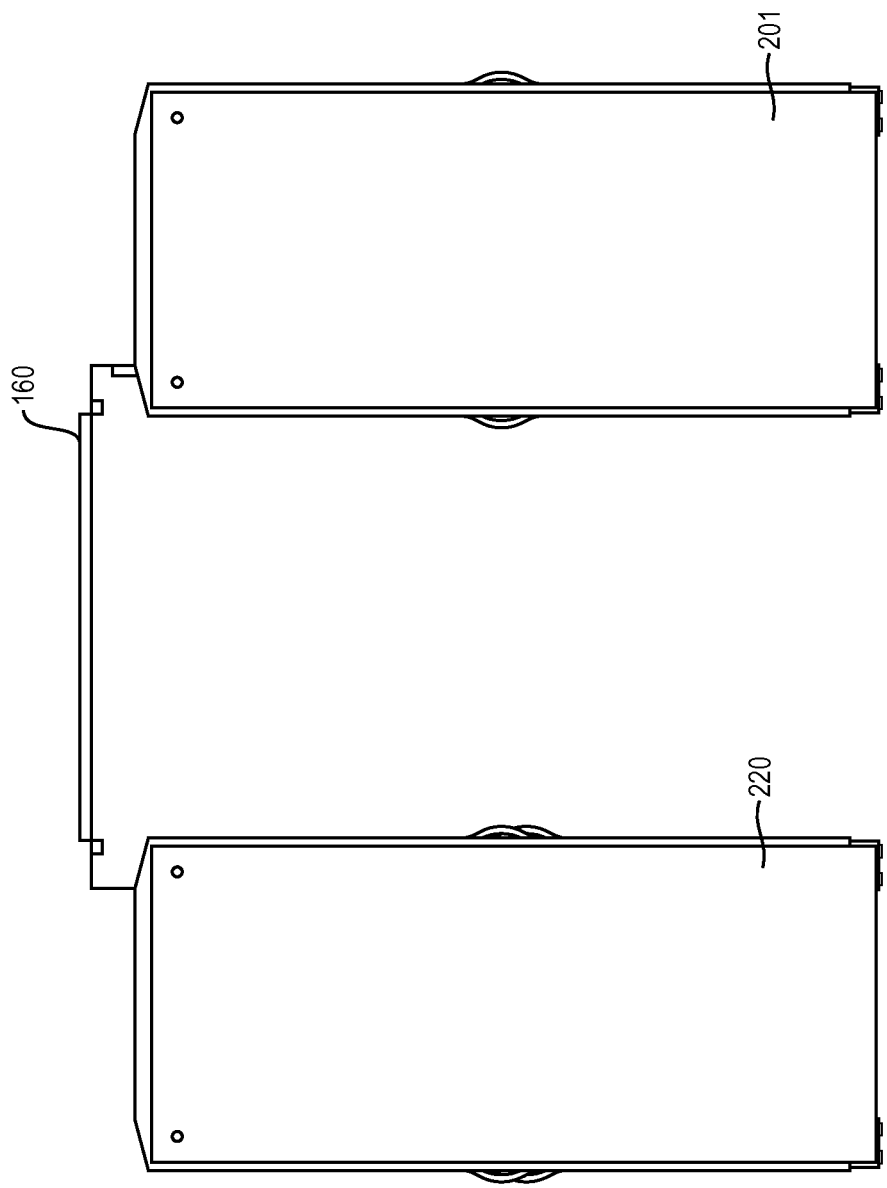

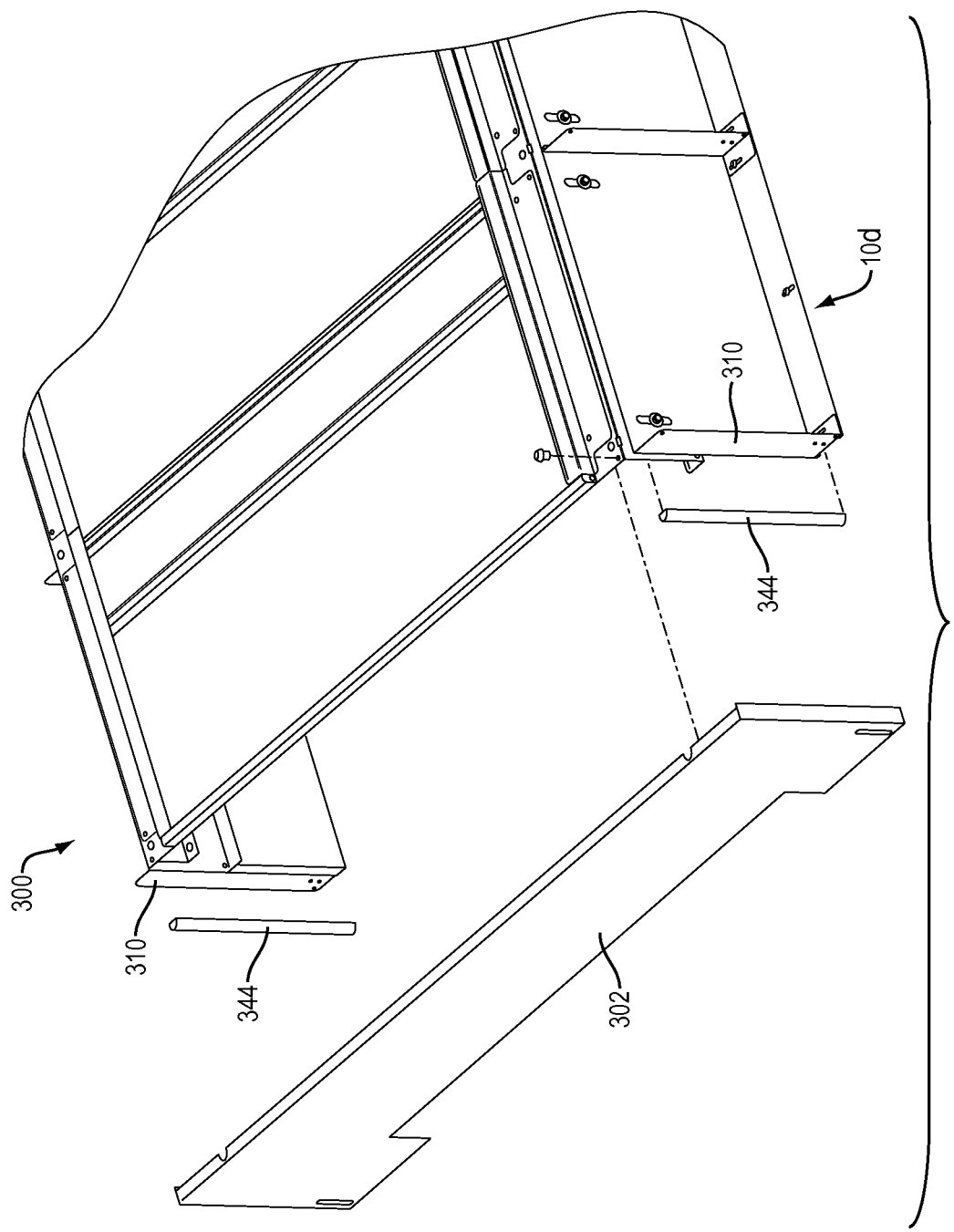

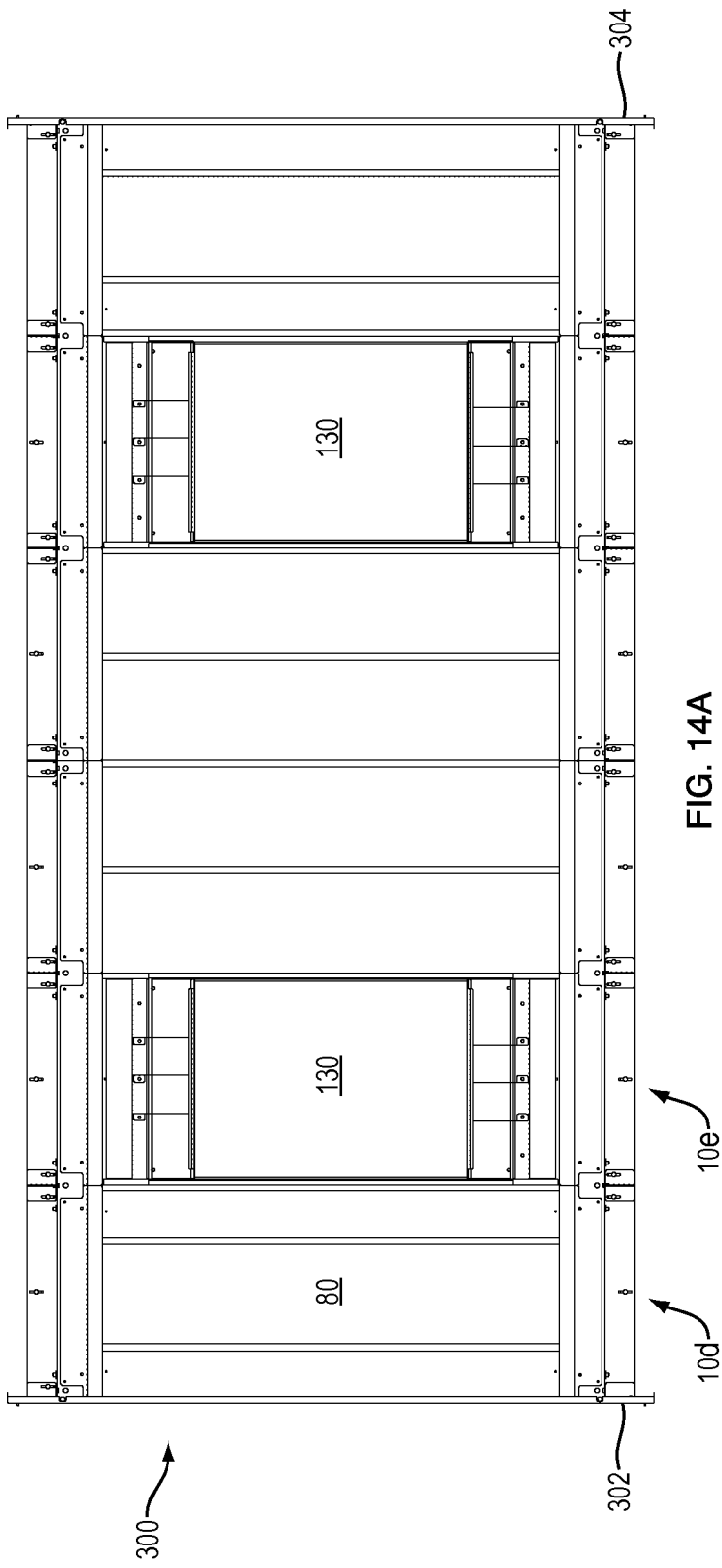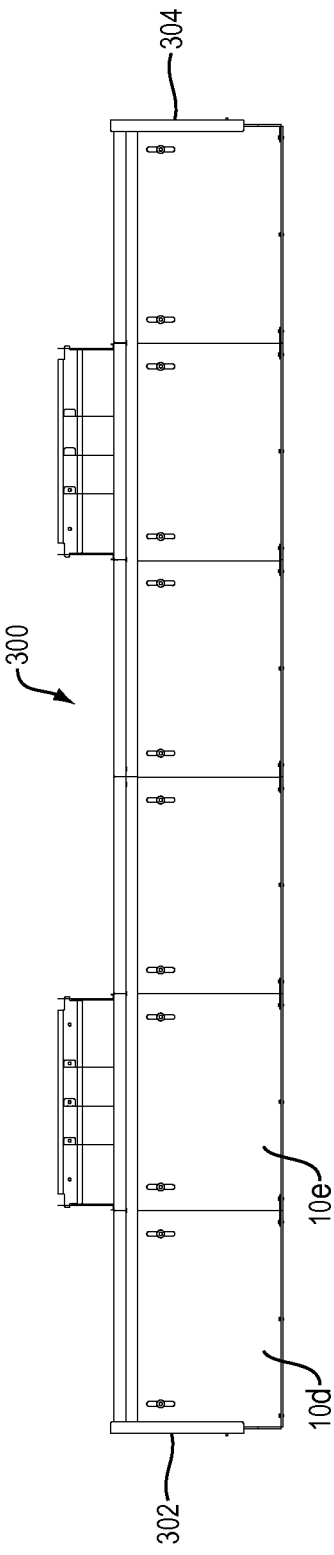
FIG. 14A
FIG. 14B

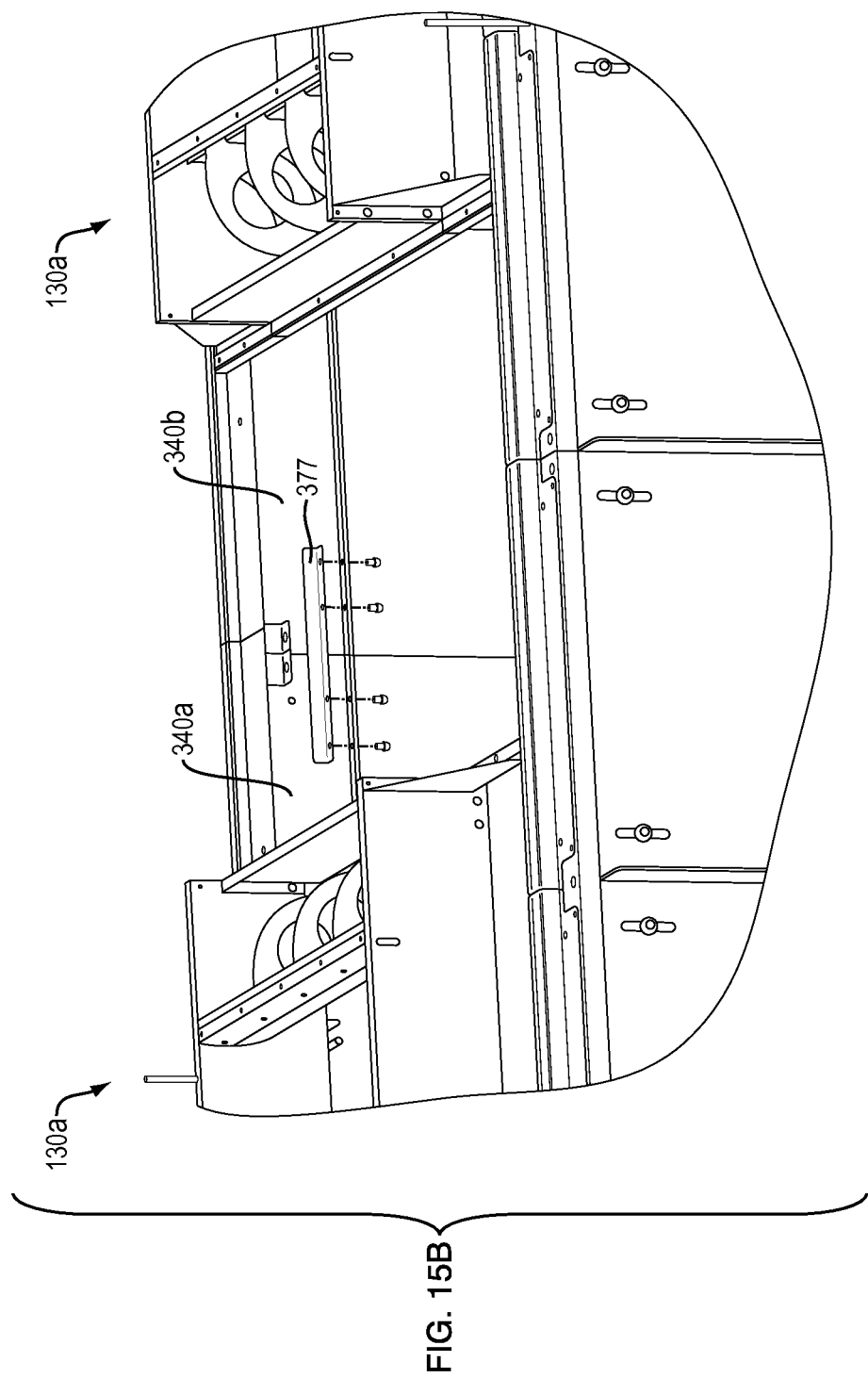

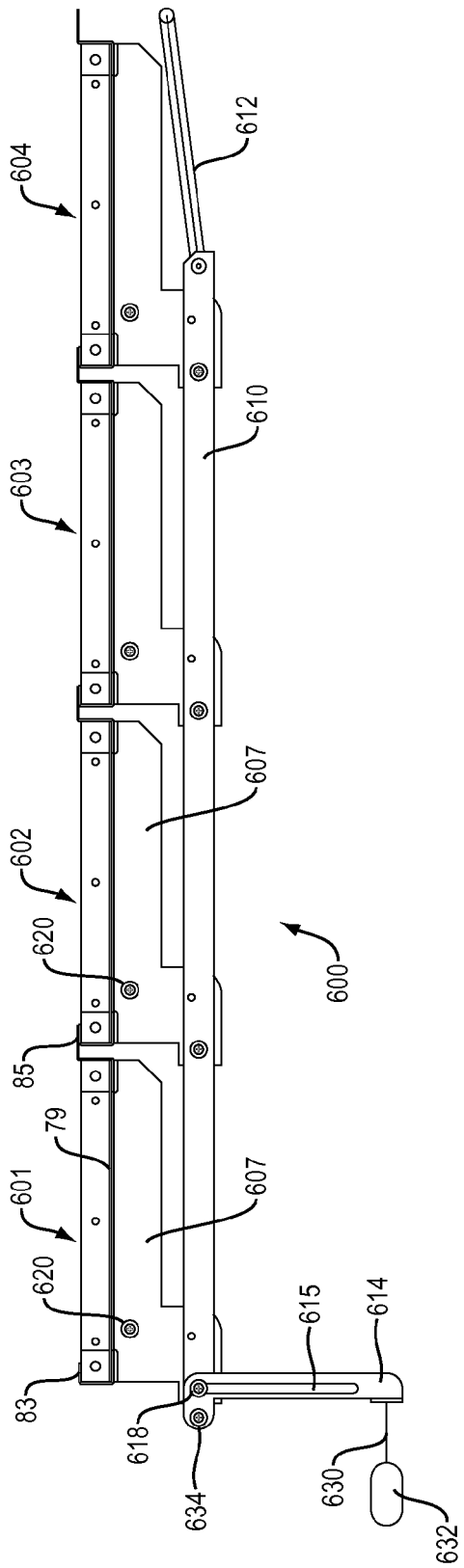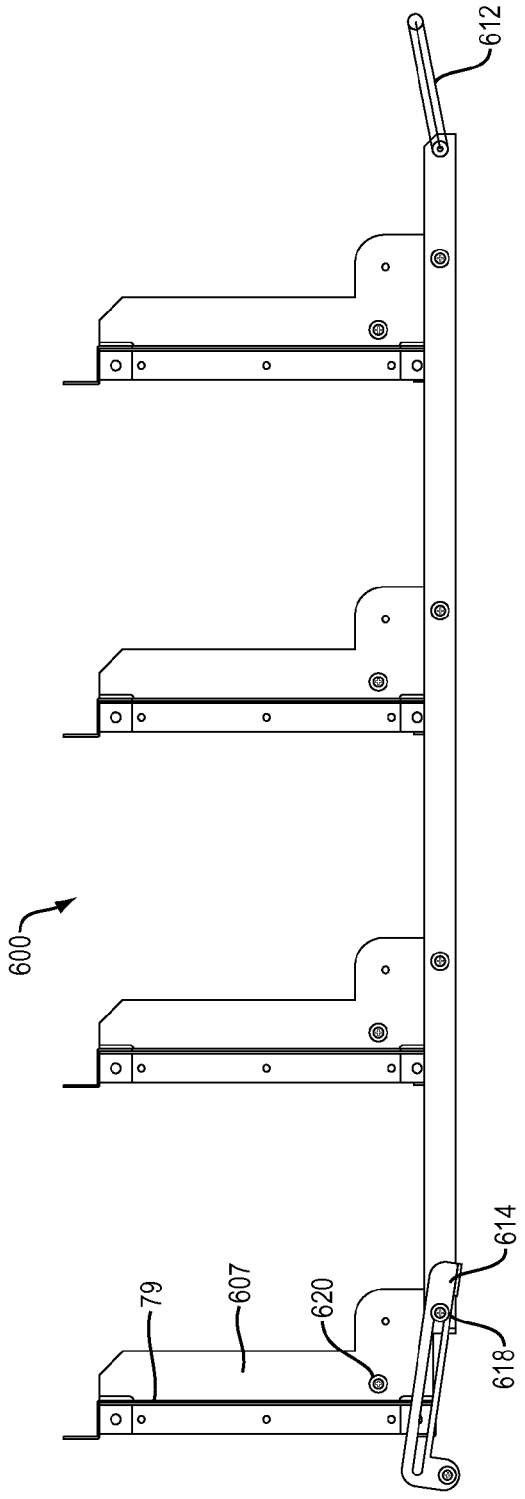
FIG. 19A
FIG. 19B

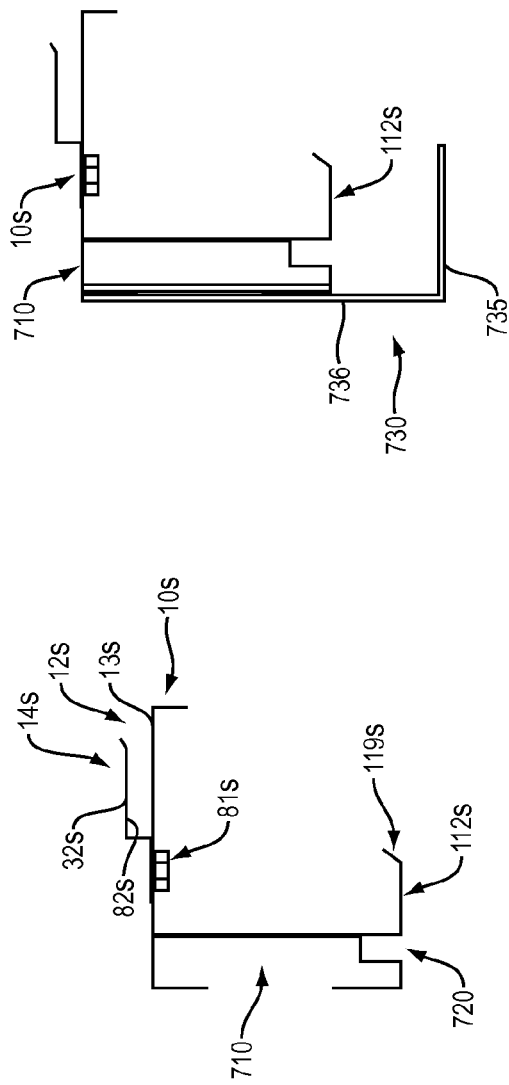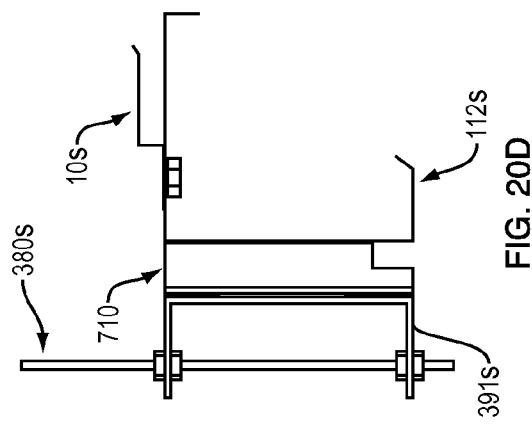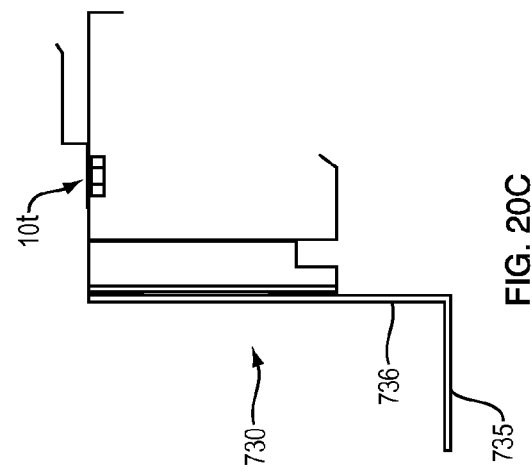
FIG. 20A  FIG. 20B  FIG. 20C  FIG. 20D

AISLE ENCLOSURE SYSTEM

CROSS-REFERENCE TO RELATED APPLICATION

This application claims priority to U.S. Provisional Patent Application Ser. No. 61/331,874, entitled "Aisle Containment System," filed on May 6, 2010. The entire contents of the priority application are expressly incorporated by reference herein.

FIELD

The invention relates generally to the field of data center airflow and temperature management. Specifically, the invention relates to modular structures that may be used in conjunction with equipment racks and ceiling structures in heat containment and cold-aisle isolation systems.

BACKGROUND

There is increased demand for greater equipment densities in data centers, which in turn leads to increased heat load in the data center. The equipment racks or enclosures in data centers are often located in parallel rows, where aisles are defined by two rows of racks. The equipment racks can be different widths, heights and depths. For efficient operation, it is necessary to supply cold air to the racks (in some cases without mixing the cold air with the room air), and direct heated air leaving the racks from the room without mixing the heated air with the cold air or the room air.

Custom-designed solutions for aisle enclosure are often required to couple the variably sized and shaped equipment racks to the data center's ceilings and ductwork. These solutions may not only be expensive to implement, but may also be difficult to reconfigure when the data center is rearranged or when equipment racks or enclosures are added or removed.

SUMMARY

There is a need for configurable, modular structures that can be used with equipment racks and enclosures of various shapes and sizes to provide efficient heat containment and cold-aisle isolation systems. The invention comprises modular structures that are configurable into ceiling structures that are located at the tops of equipment racks or enclosures, and specifically racks that are configured into two opposing rows that define an aisle between them. The racks can be arranged in a "cold aisle" configuration in which cold air is supplied to the aisle and then into the racks, or in a "hot aisle" configuration, in which heated air exhausted from the racks is contained within the aisles and then either exhausted or returned to an air cooler and re-used as cooling air. The ceiling structures are configured such that they can be coupled directly to the tops of the racks and thus supported by the racks. Alternatively, the ceiling structures may be suspended from the upper area of the room, in which case the ceiling structure can be configured to be fixed relative to the racks or to float relative to the racks. The ceiling thus caps an enclosed hot or cold aisle that can be configured to limit air infiltration or loss from the enclosed aisle at less than about 5%.

Advantages of the invention may include one or more of the following:
1. Air Flow Separation—The invention may be used to separate heated air from cooling air by way of containing an aisle in a data center.
2. Passive Airflow Management—The invention may be configured so as to not require additional active components to manage air flow.
3. Air Flow Directing—The invention may be used to direct cooling air directly to the front of the enclosures or to direct heated air away from the enclosures.
4. Reversible Application—The invention may be installed either in cold-aisle enclosure or hot-aisle enclosure configurations.
5. Adjustable Application—The invention may be manufactured in a range of sizes and shapes to span essentially all aisle widths (in horizontal orientations), or ceiling heights (in vertical orientation), for all commercial enclosure heights and widths.
6. Adaptable Integration—The invention may be manufactured with multiple mounting methods, including methods where the mounting is supported by the equipment enclosures (rack integrated), where the mounting is supported by the building or ceiling (suspended), or combinations of both in the same data center.
7. Cost Effective—The invention may be configured to provide structural integrity for aisle enclosure even where equipment enclosure locations are unused or where equipment enclosures or racks are removed.
8. Material Selection—The invention may be constructed in multiple materials to meet differing cost and environment requirements, including but not limited to wood, metal, polymers/resins, fabric, sheeting, cloth and coated substrates such as fiberboard or corrugate.
9. Manufacturing Methods—The invention may be constructed through multiple methods to meet different cost and environmental requirements.
10. Peripheral Compatibility—The invention may be integrated with end-of-aisle sealing devices such as doors, wall, curtains, and the like, and may also be integrated with overhead ducting and accessory rails.
11. Facility-Movement Tolerant—The invention may accommodate movement or changes in the facility's suspended structures, such as settling or swelling that occurs naturally or through external effects such as weather.

This disclosure features an aisle enclosure system for enclosing an aisle defined by two rows of racks, the aisle enclosure system comprising a ceiling structure comprising a plurality of ceiling panels and a plurality of coupling members, where the coupling members comprise a panel support member, a panel retainer member and a bracket, where the panel support member defines a vertical face and a horizontal support shelf, and the horizontal support shelf supports at least a portion of one of the ceiling panels, where the bracket defines a vertical face that is coupled to the vertical face of the panel support member, and the bracket is vertically adjustable relative to the panel support member, and where the panel retainer member defines a lower shelf coupled to the horizontal support shelf of the panel support member, and the panel retainer member is horizontally adjustable relative to the panel support member.

The panel retainer member may further define an upper shelf that is positioned above the horizontal support shelf of the panel support member to define a receiving space for at least a portion of one of the ceiling panels. The ceiling structure may further comprise at least one connector member coupled to two panel support members, where the connector member is laterally adjustable relative to the two panel support members. The ceiling panels may define an inwardly-directed flange at one end and an outwardly-directed flange at an opposing end. An outwardly-directed flange of a first ceiling panel may overly the inwardly-directed flange of a second ceiling panel.

The aisle enclosure system may further comprise one or more mounting flanges coupled to the coupling members, where the mounting flange defines an upturned distal end, and one or more vertical blanking panels, where the vertical blanking panel defines a leg that is configured and adapted to sit on the upturned distal end of the mounting flange, such that the vertical blanking panel can be removably coupled to the mounting flange. The vertical blanking panel may further define a lower mounting structure proximate an opposing bottom end; the lower mounting structure may be configured and adapted to be removably coupled to a track.

The aisle enclosure system may further comprise an aisle duct adaptor that comprises a pair of flanges configured and adapted to couple the aisle duct adaptor to the tops of one or more racks. The aisle duct adaptor may define a generally rectangular opening defined by opposing lateral walls and opposing end walls, where the opening is configured and adapted to convey air into or out of the aisle. The aisle enclosure system may further comprise a plurality of hanger structures. The hanger structures may comprise a threaded rod that defines an upper attachment portion and a lower attachment portion, where the upper attachment portion is configured and adapted to be suspended from a portion above the top of the racks and the lower attachment portion is coupled to one of the coupling members.

At least one ceiling panel may be pivotably coupled to a moveable structure, where the moveable structure is configured and adapted to position the ceiling panel in a closed position, such that the aisle is closed to the area above it, when the moveable structure is in a first position, and where the moveable structure is configured and adapted to position the ceiling panel in an open position, such that the aisle is open to the area above it, when the moveable structure is moved to a second position. The moveable structure may be configured and adapted to move from the first position to the second position in response to an alarm condition.

Featured in another embodiment is an aisle enclosure system for containing an aisle located between two rows of racks, the aisle enclosure system comprising a ceiling structure comprising a plurality of ceiling panels and a plurality of coupling members, where at least one of the coupling members comprises a panel support member that supports at least a portion of at least one ceiling panel, a bracket that is configured and adapted to couple the coupling member to the top of a rack, and a panel retainer member coupled to the panel support member, where the bracket is vertically adjustable relative to the panel support member, and where the panel retainer member is horizontally adjustable relative to the panel support member.

At least two of the ceiling panels may overlie one another. The aisle enclosure system may further comprise a connector member coupled to two coupling members. The aisle enclosure system may further comprise one or more vertical blanking panels coupled to the coupling members. The vertical blanking panels may be further coupled to a track. The aisle enclosure system may further comprise an aisle duct adaptor coupled to at least coupling member, where the aisle duct adaptor defines an opening configured and adapted to convey air into or out of the aisle. The aisle enclosure system may further comprise a plurality of hanger structures coupled to the coupling members, where the hanger structures are configured and adapted to be suspended from an area above the racks. The aisle enclosure system may further comprise a structure coupled to at least one ceiling panel, where the structure is configured and adapted to position the ceiling panel in a closed position when the structure is in a first position, such that the aisle is closed to the area above it, and position the at least one ceiling panel in an open position, such that the aisle is open to the area above it, when the structure is move to a second position.

Also featured is an aisle enclosure system for enclosing an aisle defined by two rows of racks, the aisle enclosure system comprising a ceiling structure comprising a plurality of ceiling panels that adjoin one another along lateral sides thereof, and a one or more coupling members, wherein the ceiling panels are constructed and arranged to overlap one another along adjoining lateral sides, and once overlapped are adapted to be moved together and apart, to alter the length of the aisle that is covered by the adjoined ceiling panels, and wherein the coupling members comprise a ceiling panel support shelf on which a ceiling panel is engaged, and a member that is vertically adjustable in length, to alter the spacing between the ceiling panels and the top of a rack.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3B is an exploded, side view of the aisle enclosure ceiling bracket and panel assembly of FIG. 3A;

FIG. 4A is a perspective view of the aisle enclosure ceiling bracket and panel assembly of FIG. 3A in a horizontal, closed position;

FIG. 4B is a side view of the aisle enclosure ceiling bracket and panel assembly of FIG. 4A;

FIG. 5A is a perspective view of an aisle enclosure ceiling bracket and panel assembly in a vertical position, according to an additional preferred embodiment of the invention;

FIG. 5B is a side view of the aisle enclosure ceiling bracket and panel assembly of FIG. 5A;

FIG. 12B is an end view of the equipment racks and ceiling assembly of FIG. 12A;

FIG. 13C is a detailed view of one end panel of the suspended ceiling assembly of FIG. 13A;

FIG. 14A is a top view of the suspended ceiling assembly of FIG. 13A;

FIG. 14B is a side view of the suspended ceiling assembly of FIG. 13A;

FIG. 15B is a perspective view of a portion of a suspended ceiling assembly, showing the use of a tie bar to couple adjacent ceiling bracket assemblies, according to an additional preferred embodiment of the invention;

FIGS. 19A and 19B are schematic side views of an alternative arrangement of ceiling panels that are constructed and arranged to automatically move from a normal closed position to an open position in response to an alarm condition, according to a preferred embodiment of the invention; and FIGS. 20A-20D are schematic views of alternative structures for coupling a ceiling assembly to equipment racks, according to additional preferred embodiments of the invention.

DETAILED DESCRIPTION OF EMBODIMENTS

The invention provides an aisle enclosure system, comprising modular structures, including ceiling bracket assemblies, ceiling panels, vertical blanking panels, aisle duct adaptors, and accessory rails, that may be utilized in hot-aisle or cold-aisle enclosure equipment configurations to provide more efficient airflow management.

Ceiling Bracket Assembly

Figure 1:
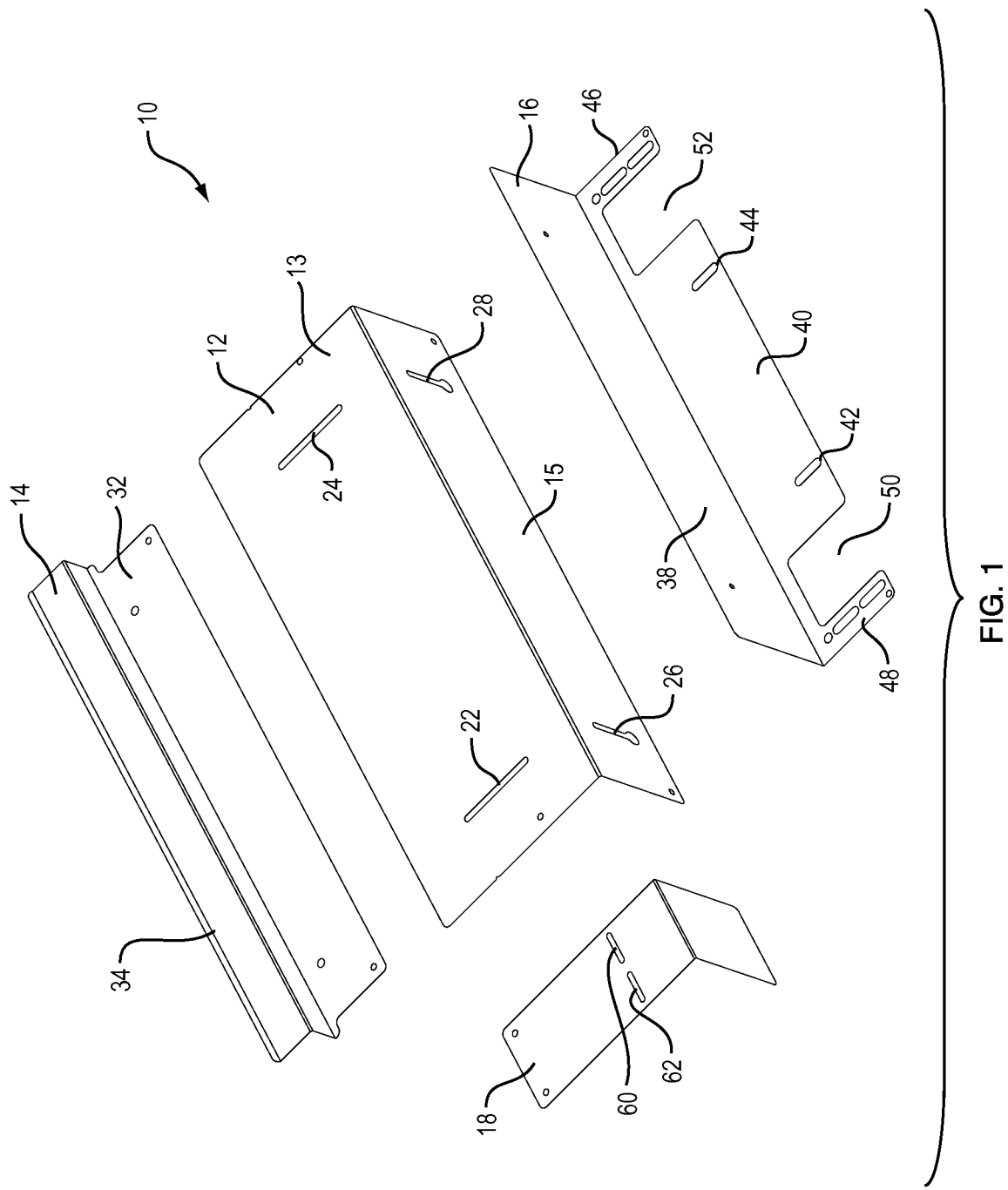
FIG. 1 is an exploded, perspective view of a ceiling bracket assembly, according to a preferred embodiment of the invention.

An exploded view of a preferred embodiment of a ceiling bracket assembly is shown in FIG. 1. As described below, the ceiling bracket assemblies are configured and adapted to support the ceiling panels, and further configured and adapted to couple to the tops of equipment racks or enclosures. The ceiling bracket assemblies are also vertically adjustable, to accommodate equipment racks of different heights, and horizontally adjustable, to accommodate ceiling panels.

Ceiling bracket assembly 10 comprises panel support member 12, panel retainer member 14, and riser bracket 16. Panel support member 12 defines horizontal support shelf 13 and vertical face 15. Panel retainer member 14 defines upper shelf 34 and lower shelf 32. Riser bracket 16 defines vertical face 38 and horizontal face 40.

Vertical face 38 of riser bracket 16 is configured and adapted to be coupled to vertical face 15 of panel support member 12 through connectors (not shown) that engage in slots 26 and 28 defined in vertical face 15. This arrangement allows for the vertical movement and adjustment of riser bracket 16 relative to vertical face 15. By designing vertical face 15 with an appropriate height, and thus accommodating slots 26 and 28 of appropriate length, the construction allows ceiling bracket assembly 10 to be used with data center racks of different heights, as shown and described below.

Lower shelf 32 of panel retainer member 14 is configured and adapted to sit or rest on horizontal support shelf 13 and is coupled by fasteners (not shown) that pass through slots 22 and 24 defined in horizontal support shelf 13. This arrangement allows for the horizontal movement and adjustment of panel retainer member 14 relative to panel support member 12, to accommodate ceiling panels and other members, as explained below. Upper shelf 34 is offset above horizontal support shelf 13 to define receiving space 82, shown in FIGS. 2 and 3B.

Connector 18 is configured and adapted to be coupled to the panel support members 12 of two adjacent ceiling bracket assemblies 10 to couple such assemblies together. This coupling is accomplished by slots 60 and 62 defined in connector 18 that allow for the lateral or side-to-side movement of connector 18 relative to panel support member 12, to accommodate variable spacing between adjacent panel support members 12.

Horizontal face 40 of riser bracket 16 defines elongated slots 42 and 44 and a series of elongated openings 46 and 48 which together provide for horizontal adjustment of riser bracket 16, as further shown and described below. Openings or cutouts 50 and 52 defined in riser bracket 16 can be included to accommodate particular rack constructions.

Figure 2:
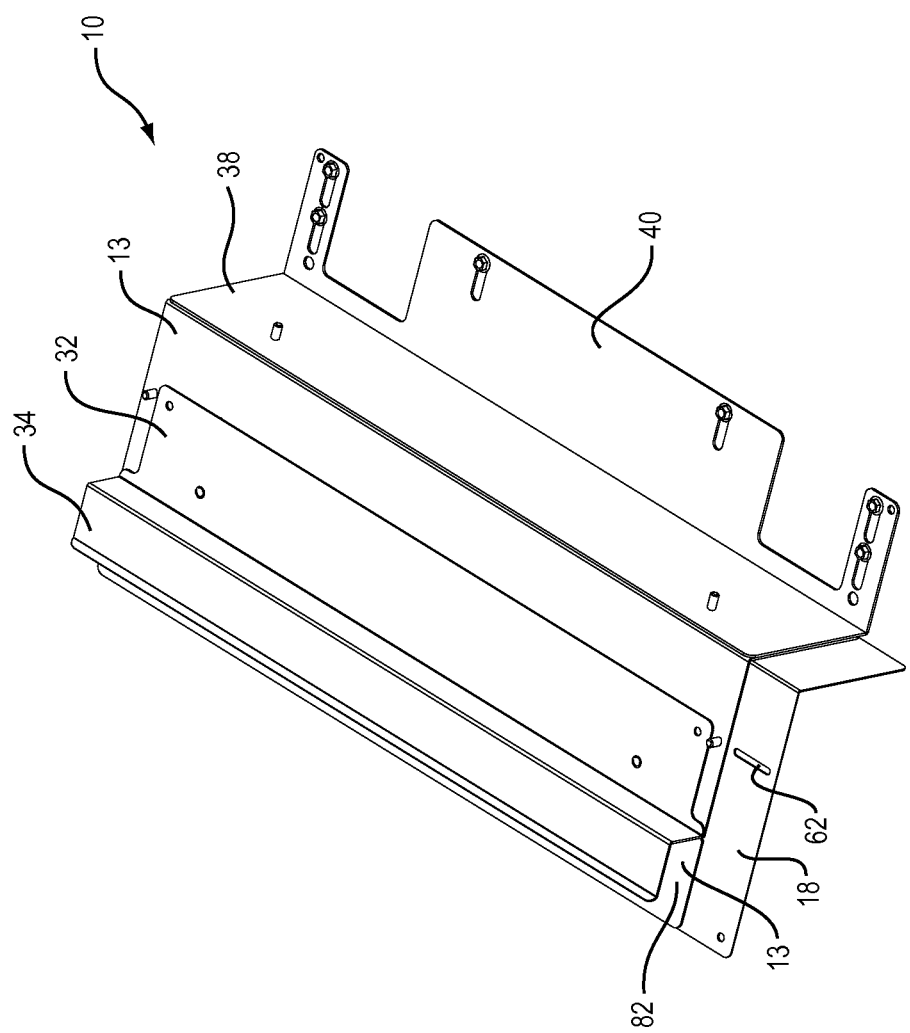
FIG. 2 is an assembled, perspective view of the ceiling bracket assembly of FIG. 1.

An assembled view of the ceiling bracket assembly 10 of FIG. 1 is shown in FIG. 2. When assembled, ceiling bracket assembly 10 further defines ceiling panel receiving space 82 between upper shelf 34 of panel retainer member 14 and horizontal support shelf 13 of panel support member 12.

Ceiling Panels

Figure 3A:
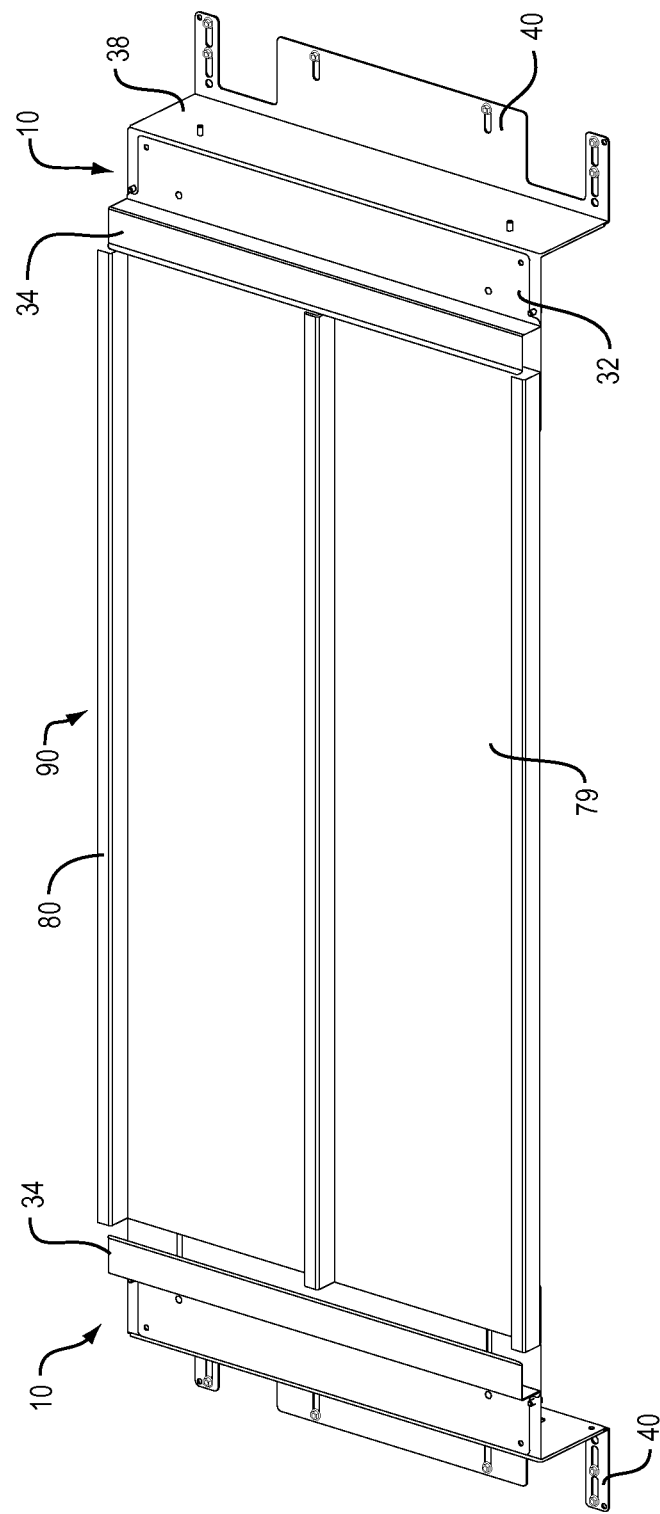
FIG. 3A is a perspective view of an aisle enclosure ceiling bracket and panel assembly in a horizontal, open position, according to a preferred embodiment of the invention.
Figure 3C:
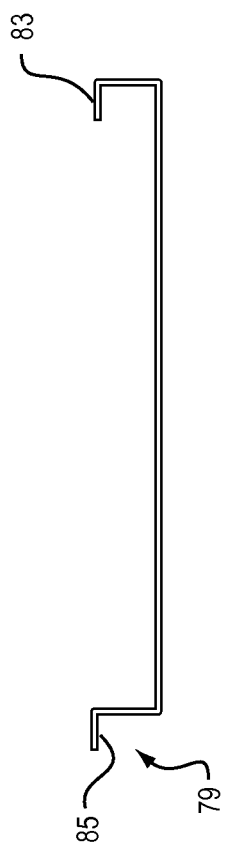
FIG. 3C is a side view of a ceiling panel, according to a preferred embodiment of the invention.

A preferred embodiment of a ceiling panel is shown in FIG. 3C. The ceiling panels are supported by the ceiling bracket assemblies, and are configured and adapted such that they inter-fit with, and overlie, one another.

Ceiling panel 79 defines inwardly-directed flange 83 at one lateral edge and outwardly-directed flange 85 at the opposing edge. As shown in FIGS. 3A and 3B, discussed in detail below, ceiling panels 79 and 80 may be constructed such that they inter-fit with one another to substantially seal the top of the ceiling against air leakage.

Figure 3D:
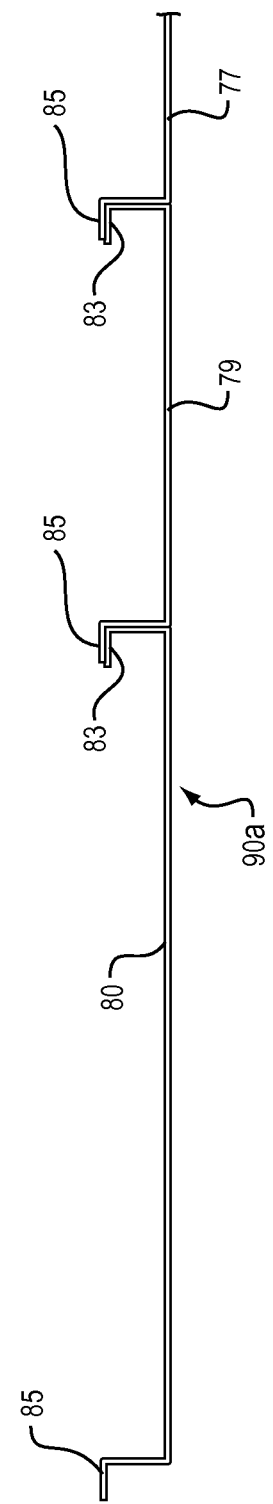
FIG. 3D is a partial side view of three inter-fitted ceiling panels of the type shown in FIG. 3C.

FIG. 3D shows an assembly 90a of three inter-fitted ceiling panels 77, 79 and 80, in which outwardly-directed flange 85 is constructed such that it overlies an inwardly-directed flange 83 of an adjacent ceiling panel. For example, and as shown in FIG. 3D, outwardly-directed flange 85 of ceiling panel 79 overlies inwardly-directed flange 83 of ceiling panel 80, and outwardly-directed flange 85 of ceiling panel 77 overlies inwardly-directed flange 83 of ceiling panel 79.

Figure 3E:
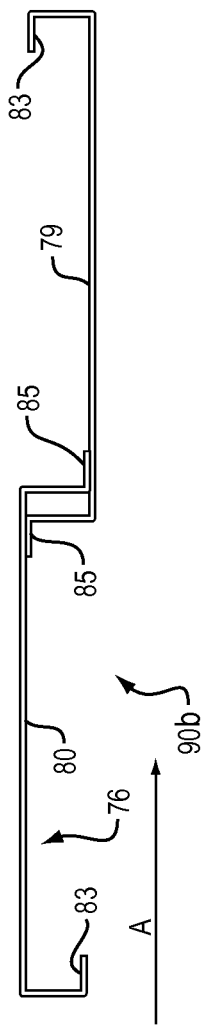
FIGS. 3E and 3F are side views of two ceiling panels of the type shown in FIG. 3C, where one ceiling panel is installed upside-down.
Figure 3F:
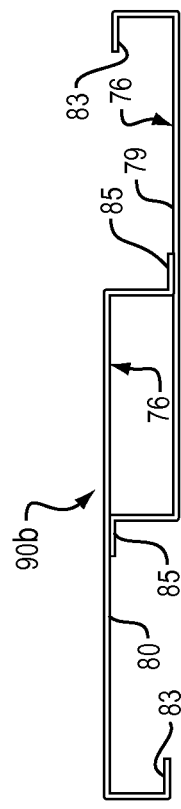

An advantage of this construction is that the width occupied by a ceiling panel can be made adjustable by installing the ceiling panel upside down. As shown in FIGS. 3E and 3F, ceiling panel 80 in ceiling panel assembly 90b is installed upside down, such that outwardly-directed flange 85 of ceiling panel 79 lies against top surface 76 of ceiling panel 80. Ceiling panel 80 can thus be slid to the right as shown by Arrow A to decrease the width occupied by ceiling panel 80. In this manner, an aisle or portion of an aisle with a particular length can be covered without having to create ceiling panels of exactly the necessary width.

Ceiling panels 79 and 80 may be made from transparent or translucent plastic so as to allow light to pass through. Alternatively, ceiling panels 79 and 80 may be made from colored plastic to block light from entering, or they can be made of other solid materials such as aluminum or steel.

Aisle Enclosure Ceiling Bracket and Panel Assembly

As shown in FIGS. 3A, 3B, 4A and 4B, a preferred embodiment of an aisle enclosure ceiling bracket and panel assembly 90 may be configured from two ceiling bracket assemblies 10 and one or more ceiling panels 79 and 80. The aisle enclosure ceiling bracket and panel assembly 90 is shown in FIGS. 3A and 3B in the open position, and is shown in FIGS. 4A and 4B in the closed, in-use position.

With further reference to FIG. 3B, ceiling panel 80 defines a flat bottom surface 84 that sits or rests on top of the horizontal support shelves 13 of two spaced, facing, ceiling bracket assemblies 10. Panel retainer members 14 may then be slid toward one another so that upper shelves 34 overlie the tops of the end portions of ceiling panel 80. As shown in FIGS. 4A and 4B, when in the closed, in-use position, the end portions of ceiling panel 80 are secured in receiving spaces 82 and enclosed by upper shelf 34.

The fasteners 81 that couple panel retainer member 14 to panel support member 12 are then tightened, thus retaining ceiling panel 80 in place. Fasteners 81 are preferably tool-less removal thumb turns. Ceiling panel 80 may be similarly decoupled from ceiling bracket assemblies 10. As shown in FIG. 4B, fasteners 81 are preferably accessible from below, so that a person located in the aisle over which the ceiling bracket and panel assembly 90 is located can add or remove ceiling panel 80.

FIGS. 5A and 5B show another preferred embodiment of an aisle enclosure ceiling bracket and panel assembly 90c, in which ceiling bracket and panel assembly 90c is used in a vertical rather than a horizontal position. In this case, ceiling bracket assemblies 10a have end flanges 11 that are preferably flat rather than offset, as in the previously described horizontal face 40 ceiling bracket assembly 10. This configuration allows one of end flanges 11 to be coupled to the top of an equipment rack, and the other end flange 11 to be coupled to a structure above the rack. In this way, ceiling bracket and panel assemblies 90c can be used to create an enclosed aisle that is taller than the equipment racks and that extends to a height dictated by the length of the ceiling panels. The aisle in this case is typically open at the top (or at least part of the top as in other embodiments described below) to fluidly couple the aisle to an air duct or plenum. Such duct or plenum can be used to deliver cold air into the aisle or to remove heated air from the aisle.

Figure 6:
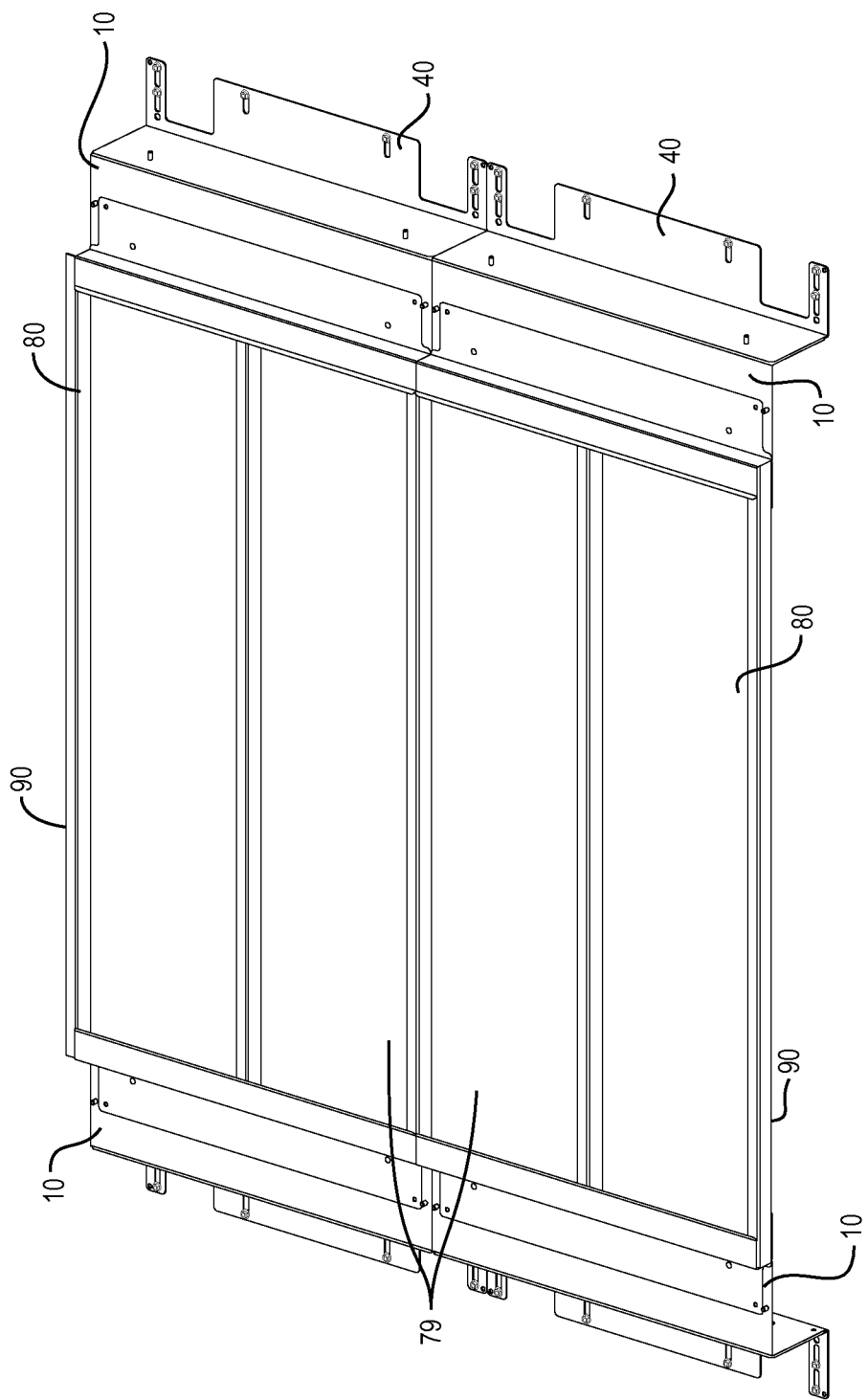
FIGS. 6 and 7 are perspective views of aisle enclosure ceiling bracket and panel assemblies, according to additional preferred embodiments of the invention.
Figure 7:
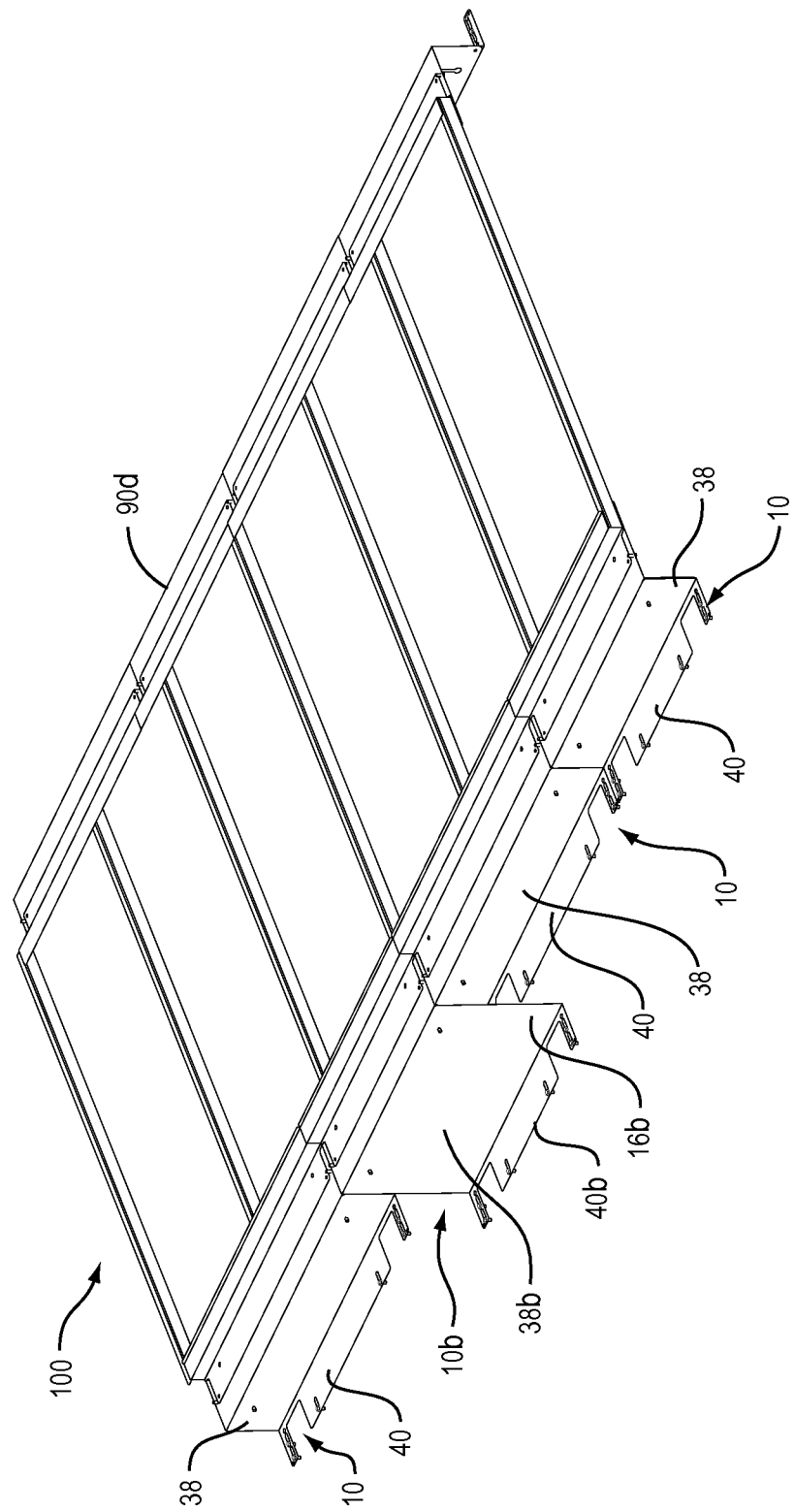

FIGS. 6 and 7 show two of numerous possible configurations of two or more aisle enclosure ceiling bracket and panel assemblies 90 that can be coupled together via an adjacent connector 18, not shown in these drawings. In FIG. 6, the horizontal faces 40 of the two adjacent ceiling bracket assemblies 10 are level with each other, which would be appropriate for use with adjacent racks of the same height. FIG. 7 shows an alternate embodiment of an aisle enclosure ceiling bracket and panel assembly 100, in which the vertical face 38b of riser bracket 16b of assembly 90d is longer than the adjacent vertical faces 38 of adjacent ceiling bracket assemblies 10. This configuration would accommodate coupling of four ceiling bracket and panel assemblies to four adjacent racks, one of which, the one coupled to ceiling bracket assembly 10b, was shorter than the other three. FIGS. 6 and 7 also illustrate that the width of the ceiling bracket assemblies 10 (and the ceilings panels, as necessary) can be varied to accommodate racks of different widths.

Figure 8B:
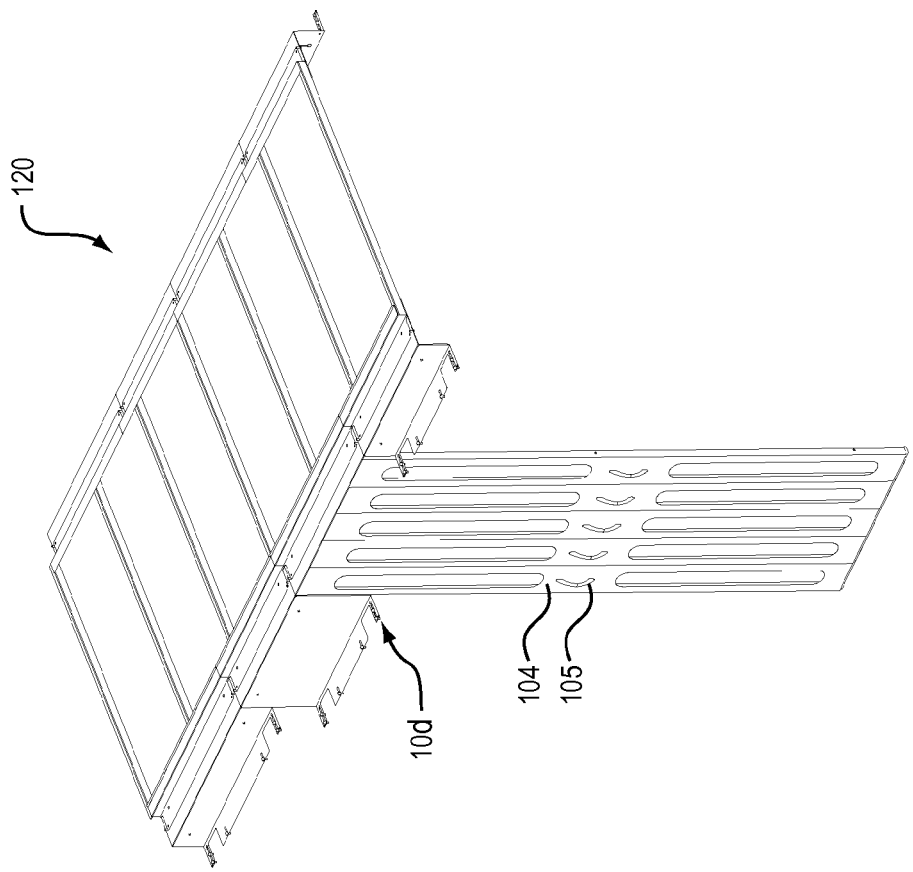
FIGS. 8A and 8B are perspective views of aisle enclosure ceiling bracket and panel assemblies, showing the addition of vertical blanking panels, according to additional preferred embodiments of the invention.
Figure 8A:
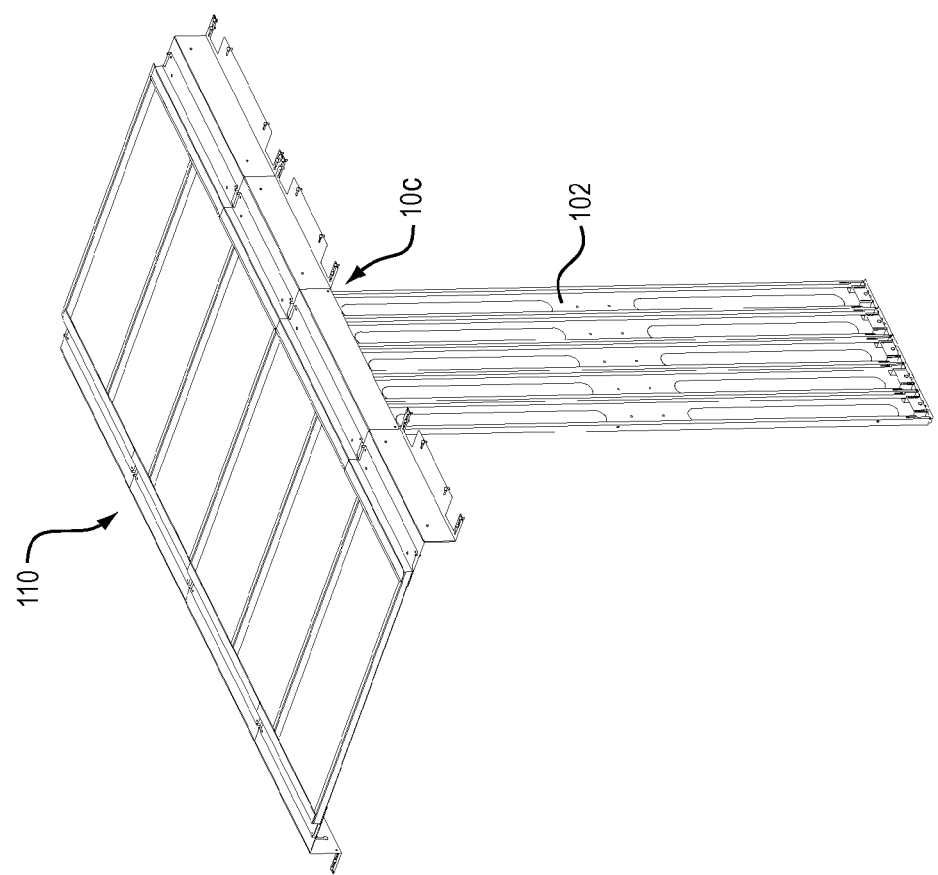

FIGS. 8A and 8B illustrate alternative embodiments of aisle enclosure ceiling bracket and panel assemblies 110 and 120, respectively. Ceiling bracket and panel assembly 110 is similar to ceiling bracket and panel assembly 100 of FIG. 7, except that vertical blanking panel group 102 is coupled to panel support member 12 of ceiling bracket assembly 10c in place of riser bracket 16. This configuration accommodates the use of ceiling bracket and panel assembly 110 in a row in which a rack that would have been at this location is missing. Ceiling bracket and panel assembly 120 of FIG. 8B is very similar, except that vertical blanking panel group 104 is coupled to ceiling bracket assembly 10d such that the handles 105 are facing out of the aisle rather than facing into the aisle as shown in FIG. 8A, to allow manual manipulation of a vertical blanking panel. This configuration would be appropriate where access is from the exterior of the aisle rather than the interior, as is the case in FIG. 8A.

Vertical Blanking Panel

Figure 9A:
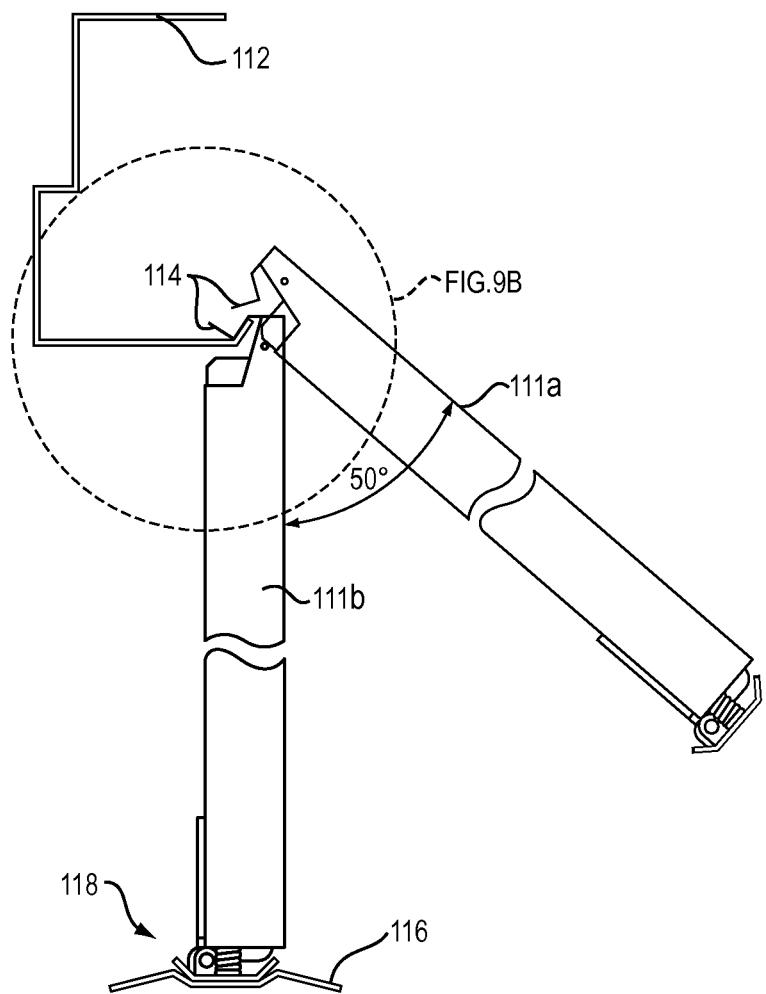
FIG. 9A is a side view of a vertical blanking panel, showing the blanking panel in both the tilted engaging position and the in-use vertical position, according to a preferred embodiment of the invention.
Figure 9B:
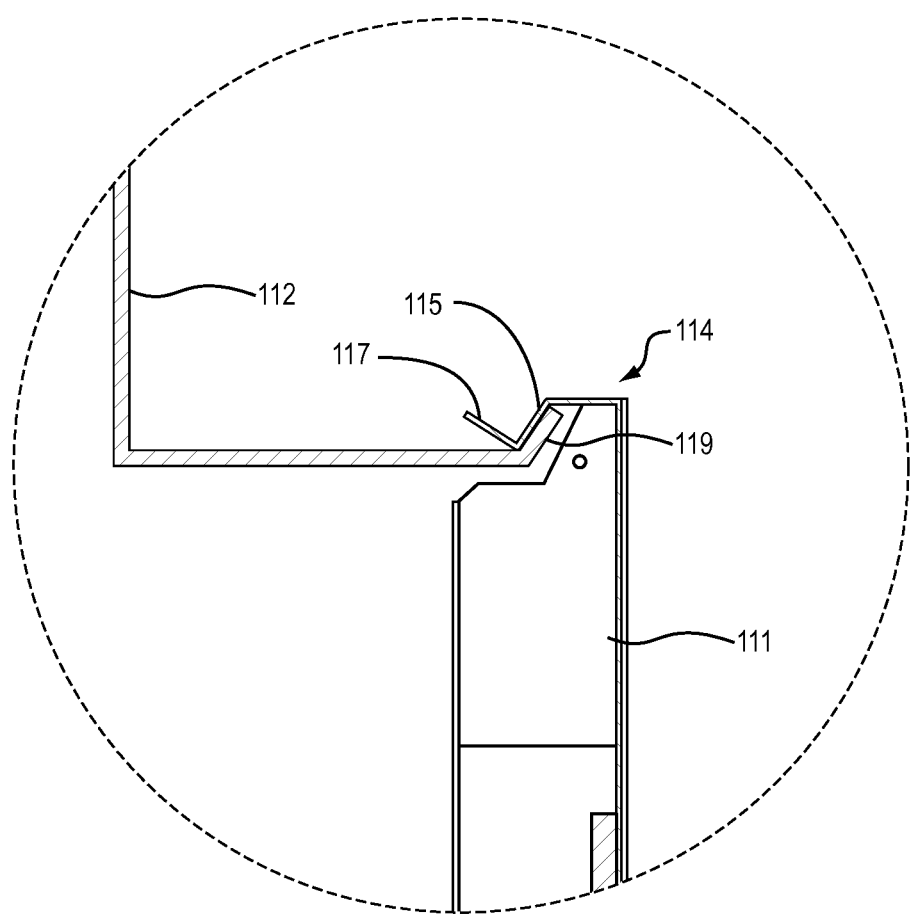
FIG. 9B is a detailed view of the hanger structure of the vertical blanking panel of FIG. 9A.
Figure 9C:
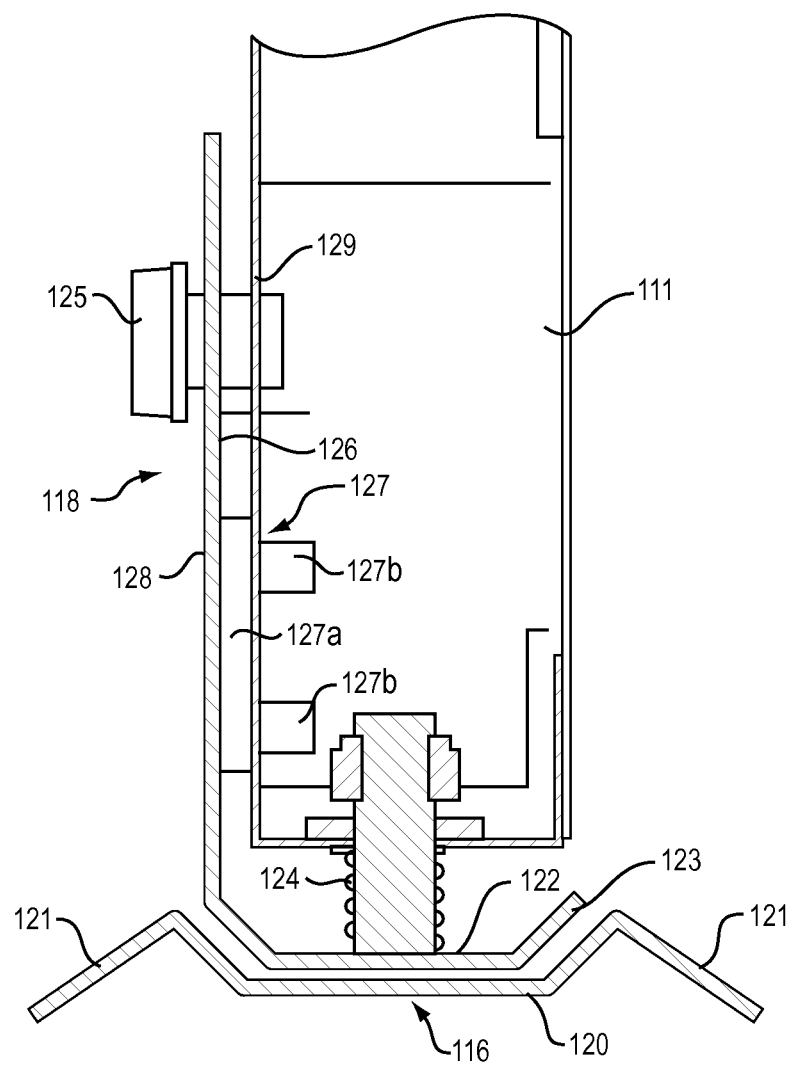
FIG. 9C is a detailed view of the lower structure of the vertical blanking panel of FIG. 9A.
Figure 12A:
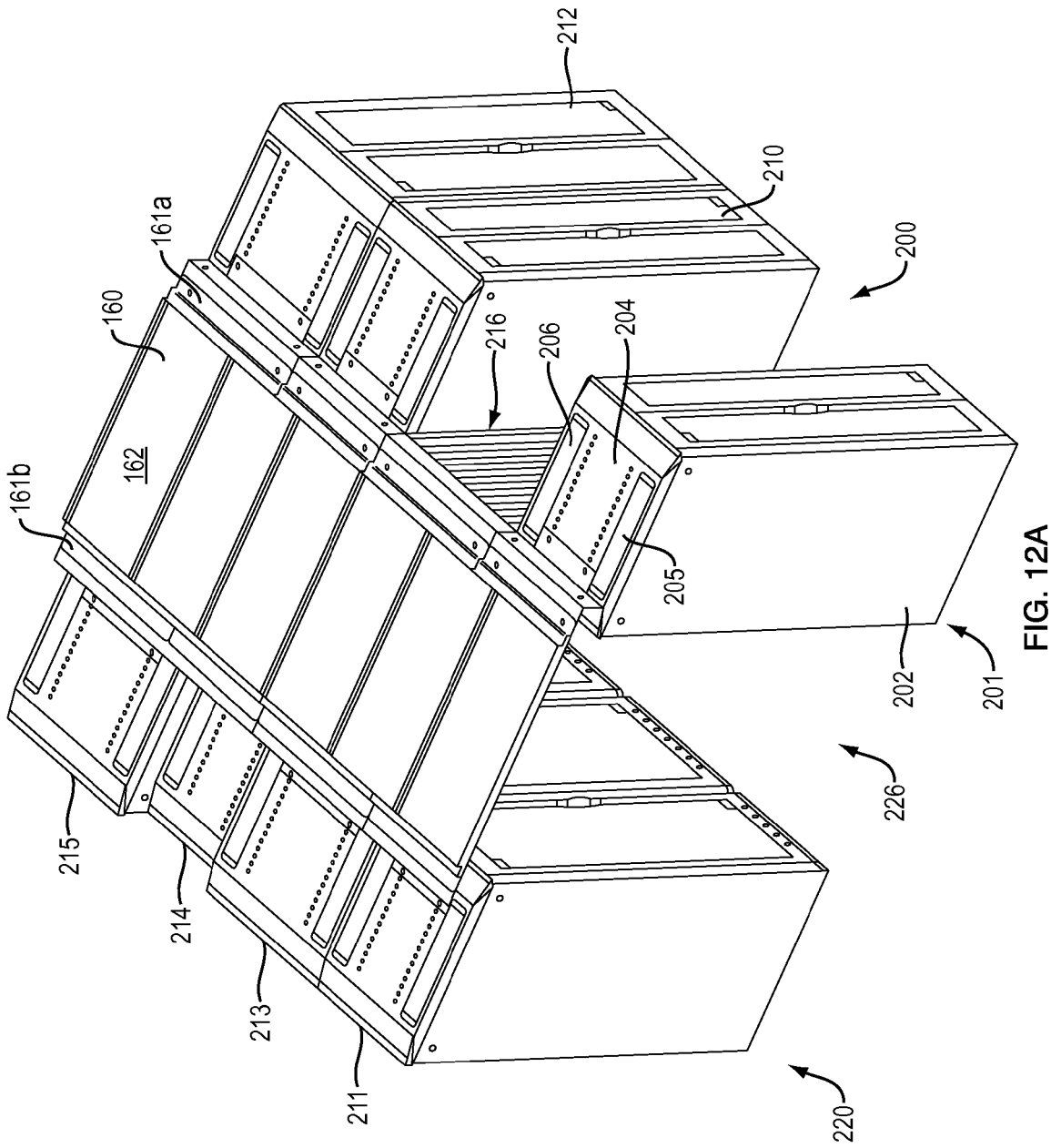
FIG. 12A is a perspective view of ceiling bracket assemblies and ceiling panels in use with parallel rows of equipment racks and vertical blanking panels, according to a preferred embodiment of the invention.

FIGS. 9A through 9C show a preferred embodiment of a single vertical blanking panel 111 that is constructed such that it can be easily installed after a roof or ceiling assembly is in place, to fill the position that would otherwise be occupied by an equipment rack, computer room air conditioning apparatus or another structure in one of the rows of the aisle, as shown for example in FIG. 12A. Vertical blanking panel 111 defines an upper mounting structure 114 at its top that allows panel 111 to be hung from mounting flange 112, and a lower mounting structure 118 at its lower end that allows panel 111 to be coupled to a track 116 that is located on the floor.

Not shown in these drawings is an optional sealing gasket located along the length of one side of the vertical blanking panel (or both sides as necessary) such that two adjacent vertical blanking panels may be sealed along their lengths, and such that the panels may be sealed to the rack on each side of the opening that is enclosed by the series of panels.

As shown in FIG. 9A, vertical blanking panel 111 is inserted by tilting the panel at about 50 degrees from the vertical, as shown in tilted engaging position 111a, engaging upper mounting structure 114 with mounting flange 112, and then pivoting the panel 111 down to the in-use vertical position 111b.

Mounting flange 112 and upper mounting structure 114 are shown in detail in FIG. 9B. Mounting flange 112 can be a member that is either part of or coupled to a ceiling bracket assembly, such as ceiling bracket assembly 10 described above. Upper mounting structure 114 defines leg 115 that sits against upturned distal end flange 119 of mounting flange 112. Upturned distal end 117 of upper mounting structure 114 may be included in this design to act as a lead-in for proper placement of panel 111 on distal end flange 119.

The construction of lower mounting structure 118 is shown in detail in FIG. 9C. Foot 128 is coupled to vertical blanking panel 111 via bolt assembly 125 that passes through vertical slot 126 in foot 128 and is anchored in portion 129 of vertical blanking panel 111. Plastic guide and glide member 127 has block 127a that supports proper spacing and movement of foot 128 relative to vertical blanking panel 111. Pegs 127b hold guide and glide member 127 in place on portion 129 of vertical blanking panel 111. At the bottom of the assembly, horizontal foot portion 122 is coupled to spring-loaded peg 124; there may be two spaced such pegs to accomplish smoother operation. This construction allows horizontal foot portion 122 to move in and out relative to the lower end of vertical blanking panel 111.

With further reference to FIG. 9C, channel 116 defines receiving depression 120 and sloped thresholds 121. Upturned distal end portion 123 engages with the sloped threshold 121 as the vertical blanking panel 111 is moved from the tilted engaging position 111a to the in-use vertical position 111b. Spring-loaded peg 124 compresses as distal end portion 123 rides up along sloped threshold 121. Spring-loaded peg 124 then seats horizontal foot portion 122 against receiving depression 120 to define the vertical in-use position 111b, as well as accomplish a good seal to inhibit air leakage. A gasket or seal (not shown) can be included to accomplish a better seal against air leakage.

Aisle Duct Adaptor

Figure 10:
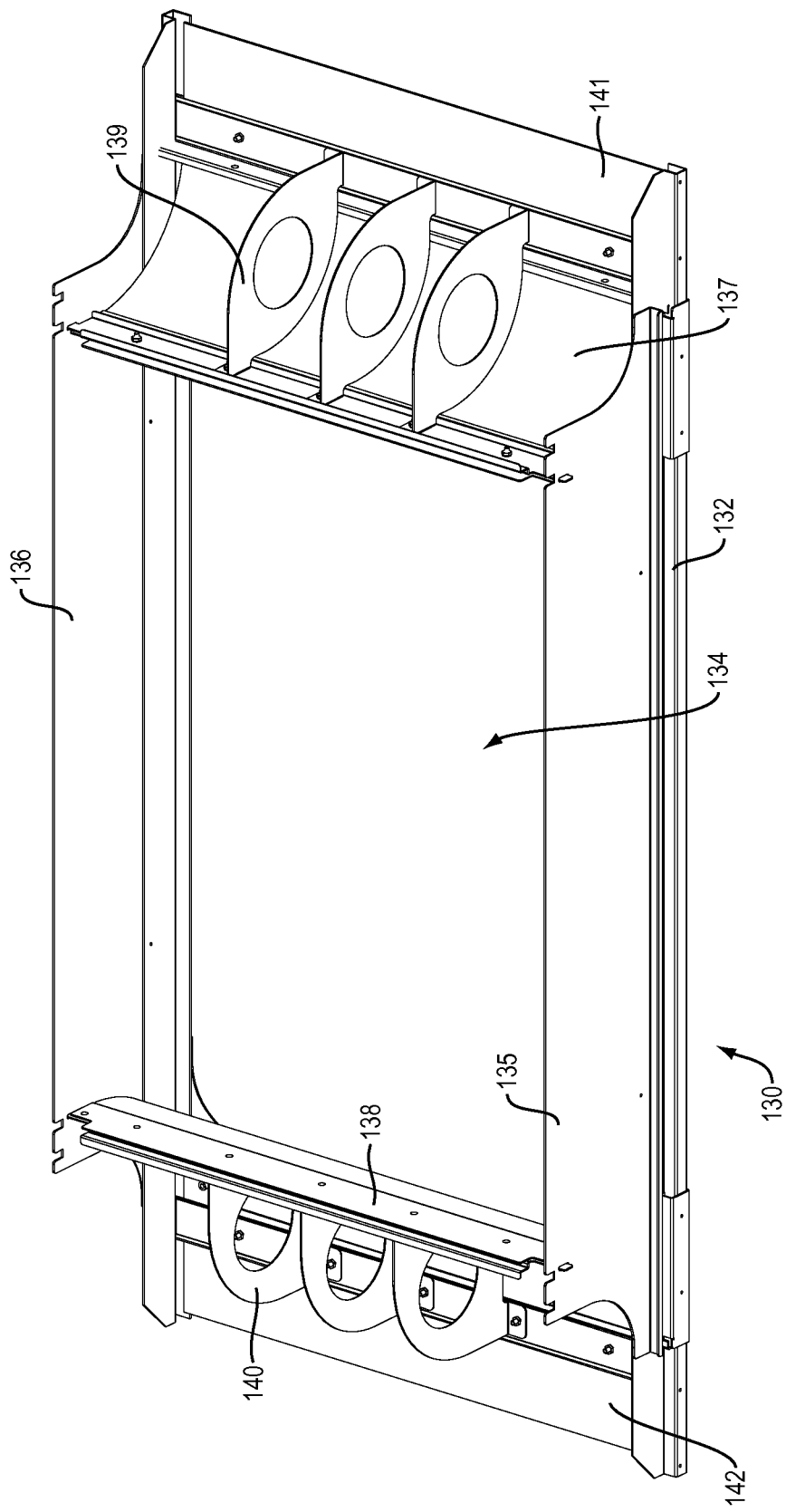
FIG. 10 is a perspective view of an aisle duct adaptor, according to a preferred embodiment of the invention.

FIG. 10 shows a preferred embodiment of an aisle duct adaptor 130 that is illustrated in use in a ceiling in FIGS. 13A, 14A, 14B, 15A and 15B. Aisle duct adaptor 130 is designed to form part of an aisle ceiling structure, and functions in part as a transition between the ceiling and a duct that is coupled to the ceiling, or to a duct that runs to a location other than the ceiling (e.g., a computer room air conditioning unit or CRAC). This duct could convey cold air into a cold aisle or convey heated air out of a hot aisle, for example.

Aisle duct adaptor 130 defines opening 134 that is located between lateral walls 135 and 136 and end walls 137 and 138. The embodiment shown in FIG. 10 has end walls 137 and 138 that are flared from the top to the bottom, while lateral walls 135 and 136 are straight. The reason for this configuration is that the flared walls 137 and 138 provide a smoother transition for the air in an adaption from an aisle that is fully open across the width of the aisle to a duct that spans less than the width of the aisle. One reason for using a smaller duct, as accommodated by this construction, is to provide room in the ceiling for wiring and other aspects of the data room to traverse this area of the ceiling.

With further reference to FIG. 10, structures 139 and 140 add rigidity to end walls 137 and 138 (which can be clear plastic panels that need support in order to maintain the curve) while also providing supported openings for cabling, wiring and the like that runs transversely through the structures. Horizontal attachment shelves or flanges 141 and 142 provide structure for attachment of aisle duct adaptor 130 to other structures of the ceiling, or to the tops of racks. Similarly, side structure 132 (and an identical structure on the opposing side, not visible in the drawing) provides structure that allows aisle duct adaptor 130 to be coupled to other ceiling members.

Accessory Rail

Figure 11:
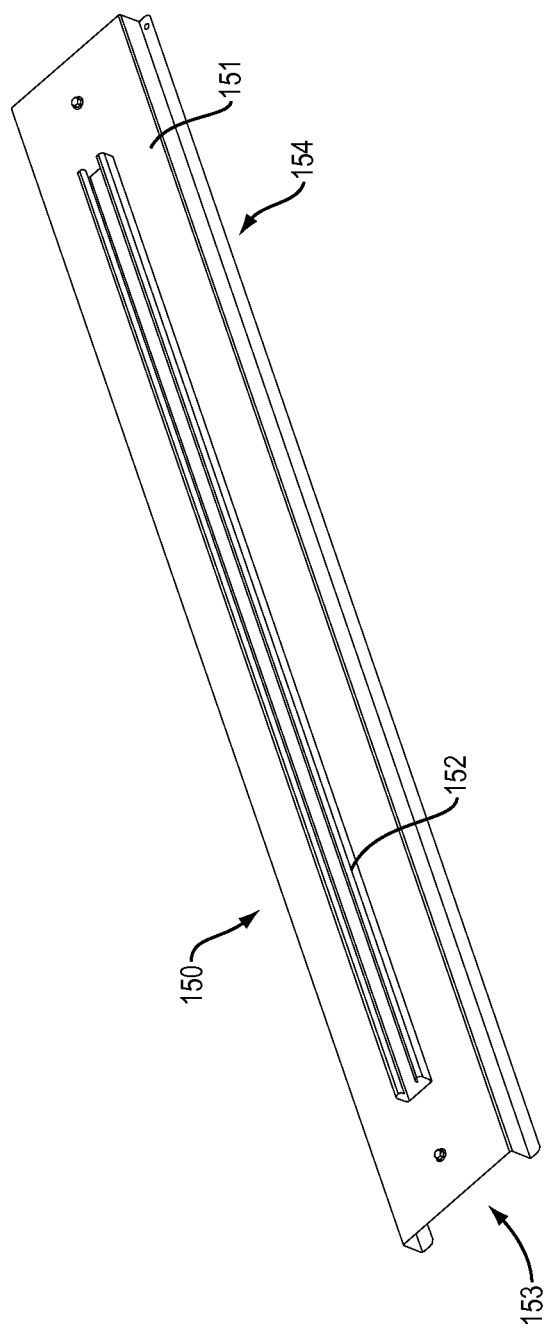
FIG. 11 is a perspective view of an accessory rail, according to a preferred embodiment of the invention.

FIG. 11 shows a preferred embodiment of an accessory rail 150, which is similar to the ceiling panels described above, although with a different function. The general construction of accessory rail 150, with a flat bottom 153 and upwardly-projecting ribs 154 on the top side 155, one of which can overlap the rib of an adjacent accessory rail or ceiling panel, mimics that of the other ceiling panels. Lower face 151 carries adaptor structure 152 that can hold an accessory to be located in the enclosed aisle, typically a fluorescent lamp or the like as a means to provide additional lighting in the aisle.

Equipment Rack, Aisle, and Ceiling Configurations

FIG. 12A is a perspective view and FIG. 12B is an end view of ceiling bracket assemblies and ceiling panels in use with parallel rows of equipment racks and vertical blanking panels. As shown in FIG. 12A, configuration 200 comprises two rows of equipment racks 201 and 220, which define aisle 226 between them. Equipment rack row 201 comprises racks 202, 210 and 212, while equipment rack row 220 comprises racks 211, 213, 214 and 215. The configuration 200 shown in FIG. 12A can be a hot aisle or a cold aisle configuration.

With further reference to FIG. 12A, the space between racks 202 and 210 in row 201 is unoccupied. Vertical blanking panels 216, as described above, are used to enclose the space between ceiling assembly 160 and the floor, to inhibit air ingress or egress from aisle 226.

Ceiling assembly 160 is typically comprised of one pair of ceiling bracket assemblies for each opposed pair of racks, for example ceiling bracket assemblies 161a and 161b, although such is not necessarily a limitation of the invention. Ceiling panels, such as ceiling panel 162, are located between the ceiling bracket assemblies 161a and 161b so as to enclose the aisle.

Ceiling bracket assemblies 161a and 161b are coupled directly to the tops of the equipment racks 212 and 215, respectively, through elongated slots or openings 42 and 44 in the horizontal face 40 of riser bracket 16, as described above. Elongated slots 42 and 44 are spaced to align with the parallel rows of openings that are typically available in the top of racks.

Equipment racks also often include elongated lateral openings, such as openings 205 and 206 adjacent to the sides of rack 202, to allow wiring to pass through the top of the rack. These openings typically carry brushes or other structures that inhibit air flow through the openings. Horizontal face 40 of riser bracket 16 further defines openings 50 and 52 that are aligned with openings 205 and 206, respectively, such that the riser bracket 16 does not block the rack openings. The roof or ceiling assembly 160 of the invention thus can be coupled directly to equipment racks comprising two spaced rows without interfering with the rack function.

Figure 13A:
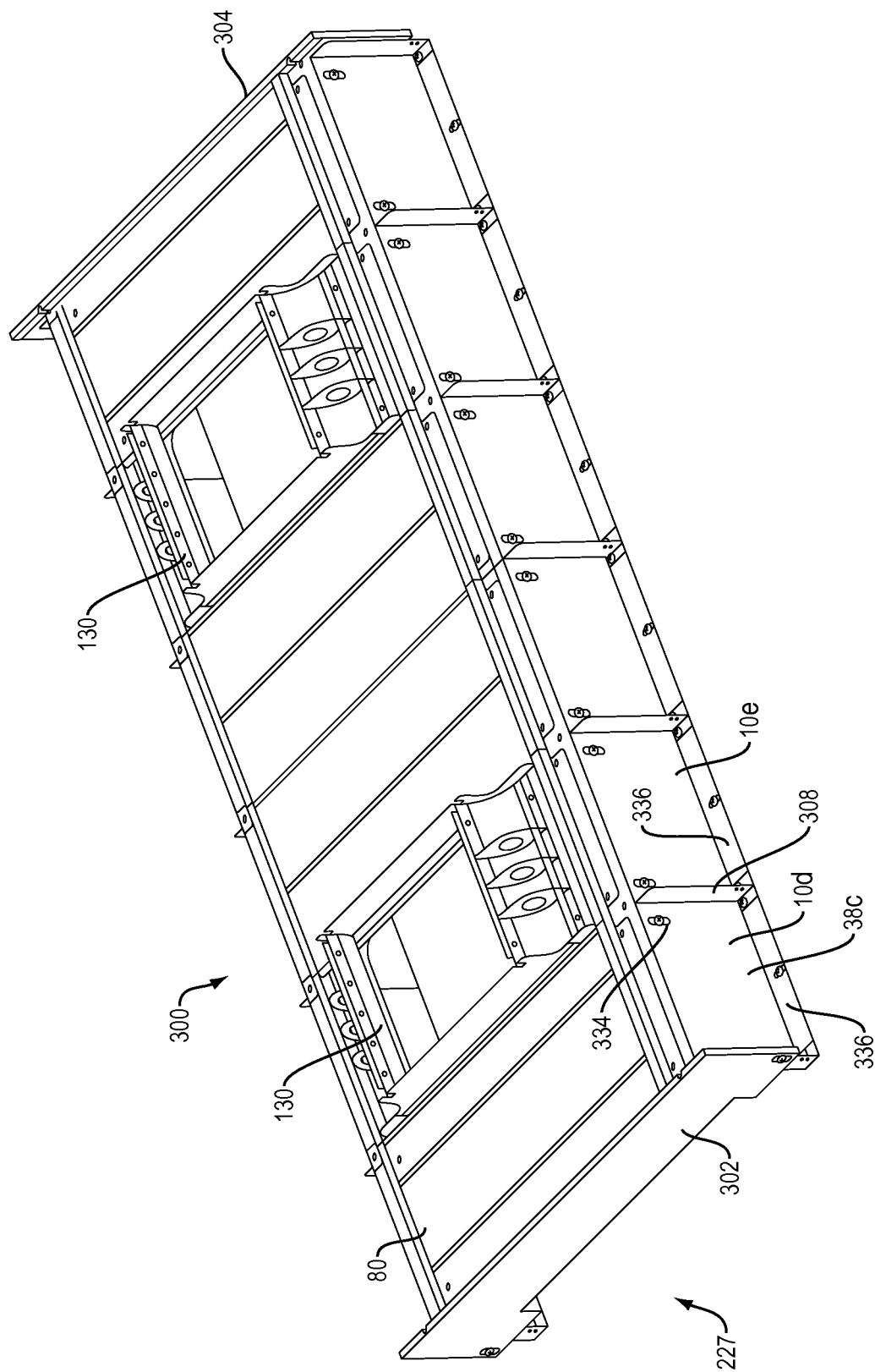
FIG. 13A is a perspective view of a suspended ceiling assembly, according to a preferred embodiment of the invention.

FIGS. 13A-C and 14A and B illustrate an embodiment of a suspended ceiling assembly 300 that is designed to either rest on top of parallel rows of equipment racks or to be suspended from above. As shown in FIG. 13A, suspended ceiling assembly 300 is defined on its four sides by end panels 302 and 304 and the outer portions of the ceiling bracket assemblies, such as assemblies 10d and 10e. In this non-limiting example, suspended ceiling assembly 300 is comprised of six adjacent subassemblies, each subassembly comprising two spaced ceiling bracket assemblies and either one or more ceiling panels, such as ceiling panel 80, and/or an aisle duct adaptor 130, located between the ceiling bracket assemblies. In this embodiment, the long axis of aisle duct adaptor 130 is perpendicular to aisle 227. As the lengths of the ceiling bracket assemblies can vary, the number of ceiling bracket assemblies in a particular ceiling assembly can be constructed as desired, depending on the configurations of the rows of equipment racks and the needs of the ceiling. Also, the quantity, locations and configurations of the ceiling panels and aisle duct adaptors can be modified as needed to achieve a desired result.

Figure 13B:
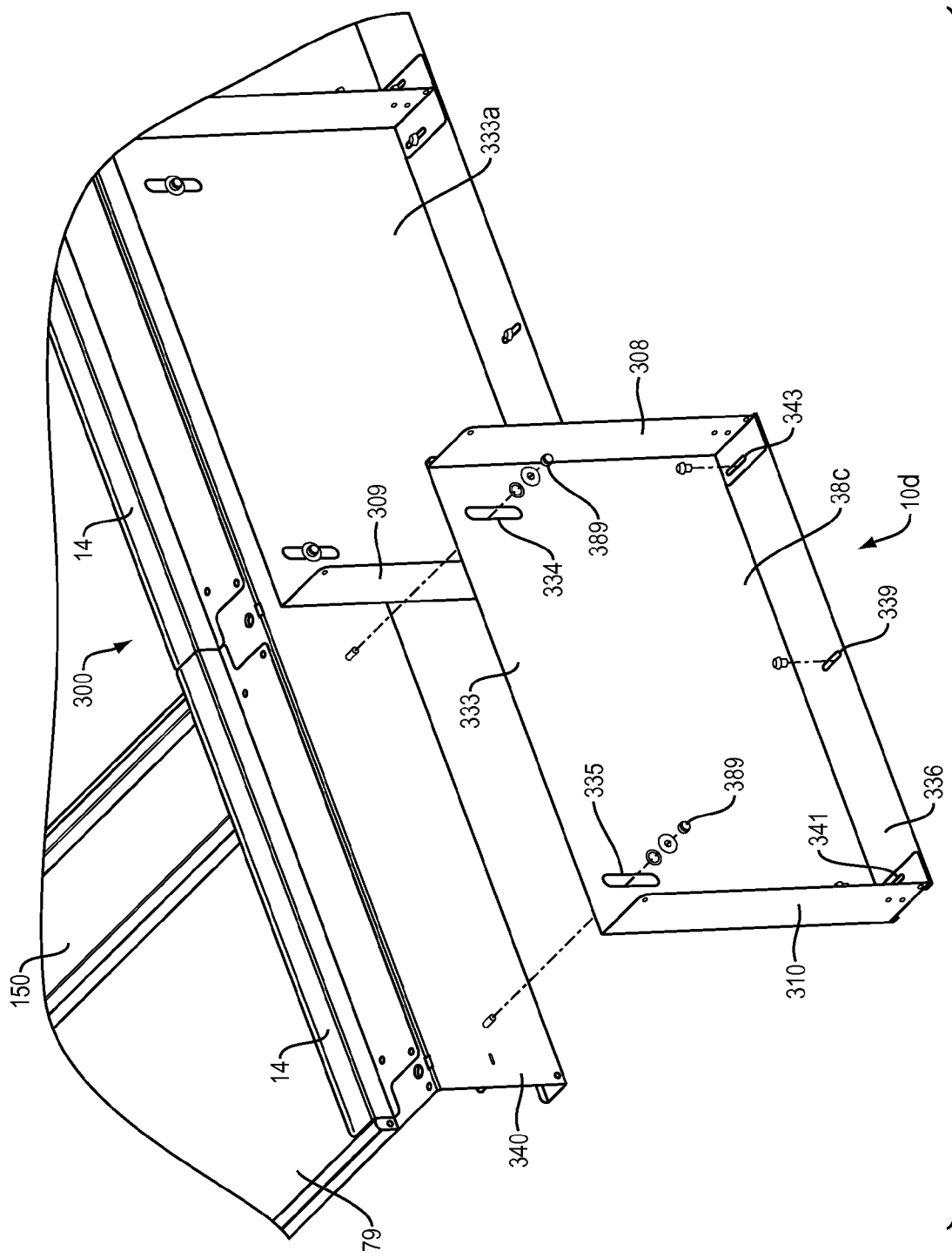
FIG. 13B is a detailed view of one ceiling bracket assembly of the suspended ceiling assembly of FIG. 13A.

As shown in FIG. 13B, ceiling bracket assembly 10d comprises panel retainer member 14, support member or bracket 340 and riser bracket 333. Support member or bracket 340 is generally "C"-shaped. Riser bracket 333 defines face 38c, which itself defines vertical slots 334 and 335 through which fasteners 389 are passed to couple riser bracket 333 to support member or bracket 340. This configuration also allows for some relative vertical movement between support member or bracket 340 and riser bracket 333. Slots 334 and 335 thus accommodate some relative vertical movement between the building superstructure or other structure from which ceiling assembly 300 is suspended, and the equipment racks to which ceiling assembly 300 is coupled through lower flanges 336.

Lower flange 336 is configured and adapted to be coupled to the top of a rack in the same manner as is horizontal face 40 of riser bracket 16, shown in FIGS. 1 and 2, via slots 339, 341 and 343. Riser bracket 333 further defines end flanges 308 and 310 that are configured and adapted to lie adjacent to the same flange of an adjacent riser bracket 333 (e.g., end flange 309 of riser bracket 333a). A gasket (not shown) can be located between adjacent end flanges to inhibit air leakage. As shown in FIG. 13C, end panel 302 is mounted to end flanges 310 of the two endmost bracket assemblies, with gaskets 344 located between them to inhibit air infiltration.

Figure 16A:
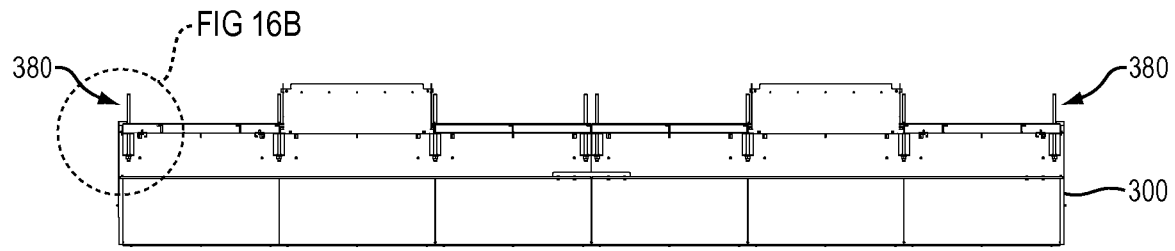
FIG. 16A is an end view of a ceiling assembly, showing hangers used to suspend the ceiling assembly, according to a preferred embodiment of the invention.
Figure 16B:
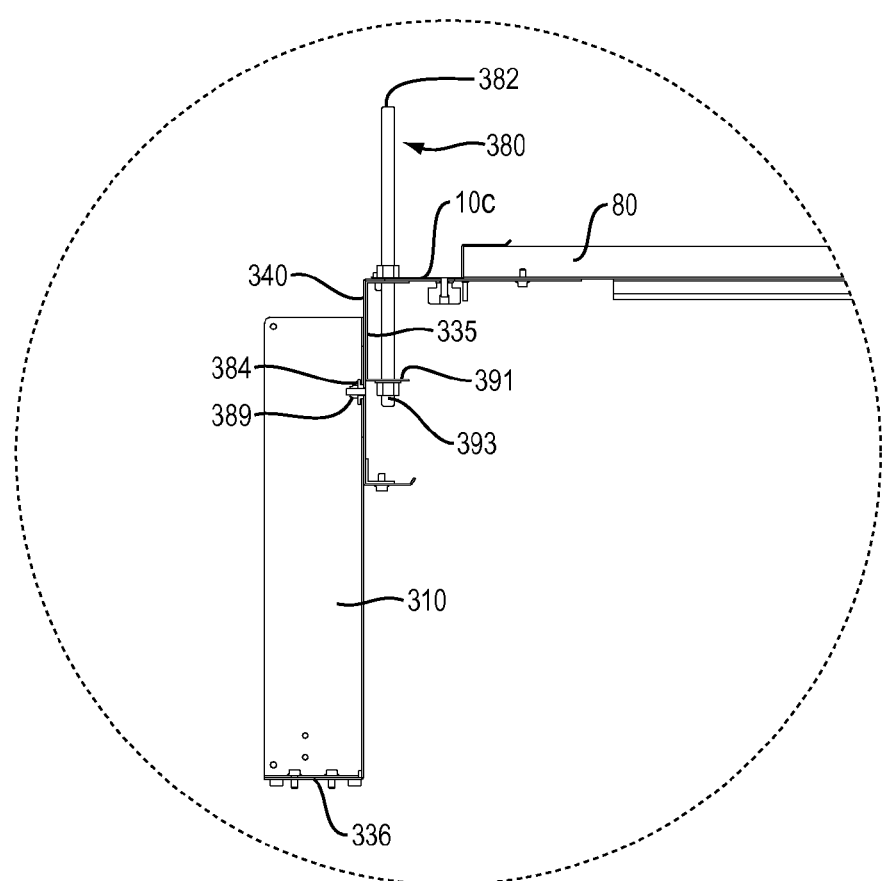
FIGS. 16B and 16C are detailed view of the hanger and ceiling assembly of FIG. 16A.
Figure 16C:
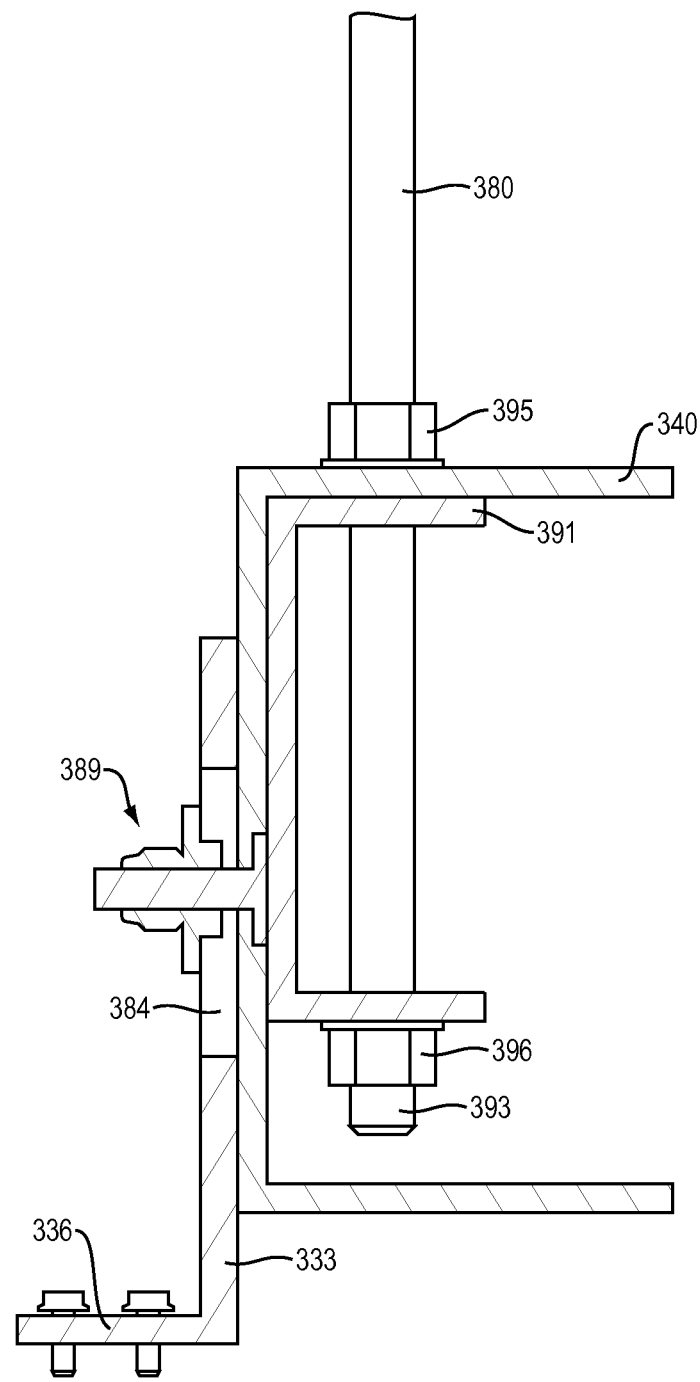

As previously stated, and as shown in FIGS. 16A-C, ceiling assembly 300 is preferably constructed such that it can be hung or suspended from a building superstructure or other structure located above ceiling assembly 300.

The suspension of ceiling assembly 300 may be accomplished with a series of hangers 380. Hanger 380 is preferably a threaded rod that defines an upper attachment portion 382 and a lower attachment portion 393. Upper attachment portion 382 is preferably coupled to a ceiling, a truss or some other portion of the building. Lower attachment portion 393 is coupled to mounting flange 391 that is carried inside of support member or bracket 340 to add reinforcement to bracket 340 at the locations that are coupled to hanger 380. Nuts 396 and 395 maintain hanger 380 in place relative to support member or bracket 340 and mounting flange 391.

Fasteners 389 pass through slots 334 and 335, and can comprise a bolt, a wave washer, a shoulder washer and a lock nut, to accomplish an interconnection between support member or bracket 340 and mounting flange 391. Fastener 389 allows for vertical adjustment, specifically a distance equal to the length of slot 384. When lower flange 336 is coupled to the top of a rack, this construction allows some relative vertical movement between the suspended ceiling assembly and the racks, to accommodate flexing of the building and other motions typically caused by natural phenomena such as wind or earthquakes, or vibrations or other motions that are man-made.

Figure 15A:
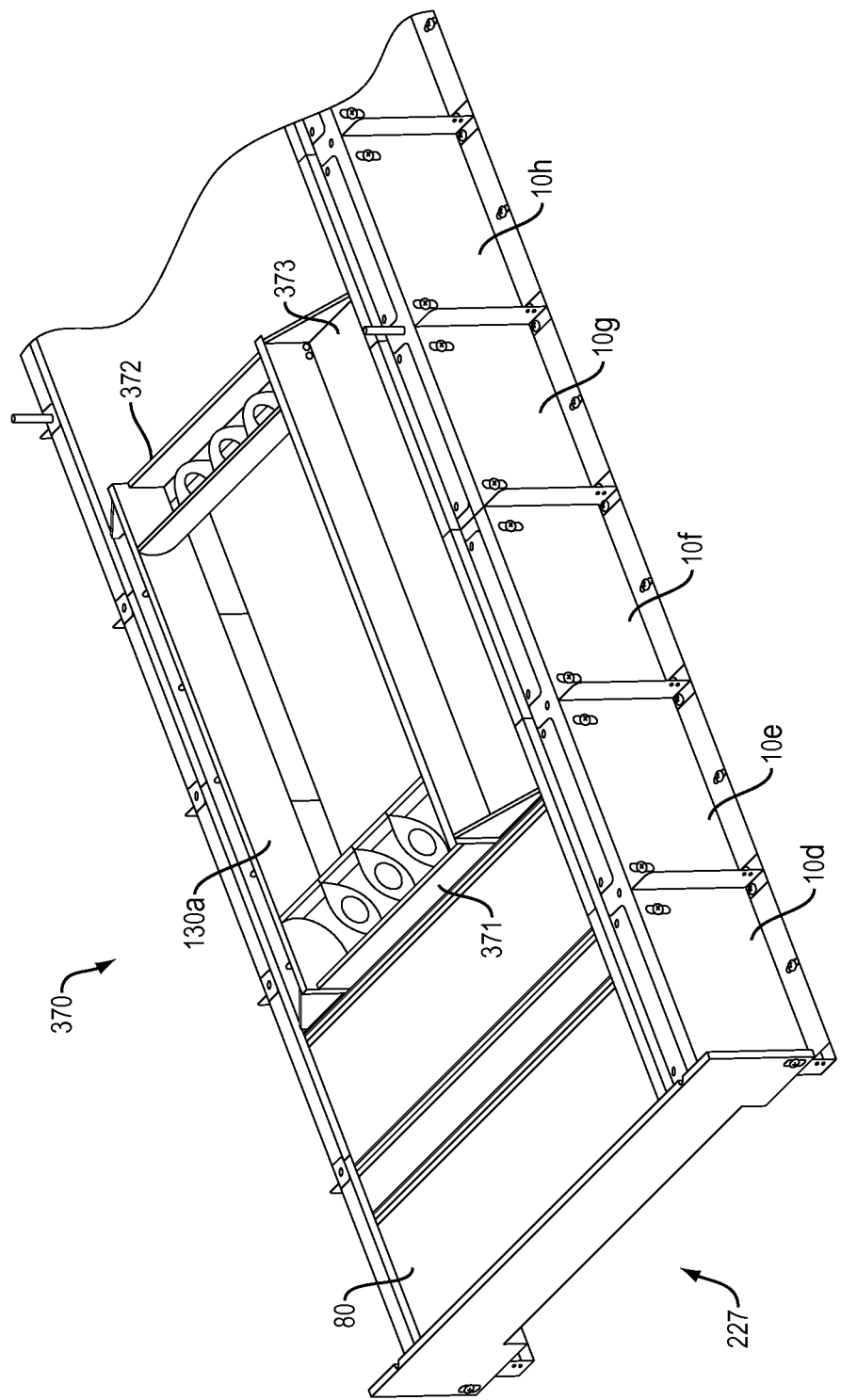
FIG. 15A is a perspective view of a suspended ceiling assembly, according to an additional preferred embodiment of the invention.

FIGS. 15A and 15B illustrate additional embodiments of a suspended ceiling assembly that is designed to either rest on top of parallel rows of equipment racks or to be suspended from above. As shown in FIG. 15A, suspended ceiling assembly 370 comprises aisle duct adaptor 130a, ceiling bracket assemblies, such as assemblies 10d-10h, and ceiling panels, such as panel 80. Aisle duct adaptor 130a has been rotated 180 degrees from the position shown in FIG. 13A, such that the long axis of aisle duct adaptor 130a is now parallel to aisle 227. In this embodiment, end brackets 371 and 372, and intermediate filler panels such as filler panel 373, can be added such that aisle duct adaptor 130a can be coupled to the ceiling bracket assemblies in the same manner as the ceiling panels are coupled via panel support members 12 and panel retainer members 14, as described above. Alternatively, aisle duct adaptor 130a may be coupled to ceiling bracket assemblies via constructions similar to those shown and described in FIGS. 13A-13C.

As shown in FIG. 15B, two adjacent bracket assemblies may be coupled together with the use of a tie bar 337 screwed to the lower horizontal flanges of adjacent bracket assemblies 340a and 340b.

Figure 17:
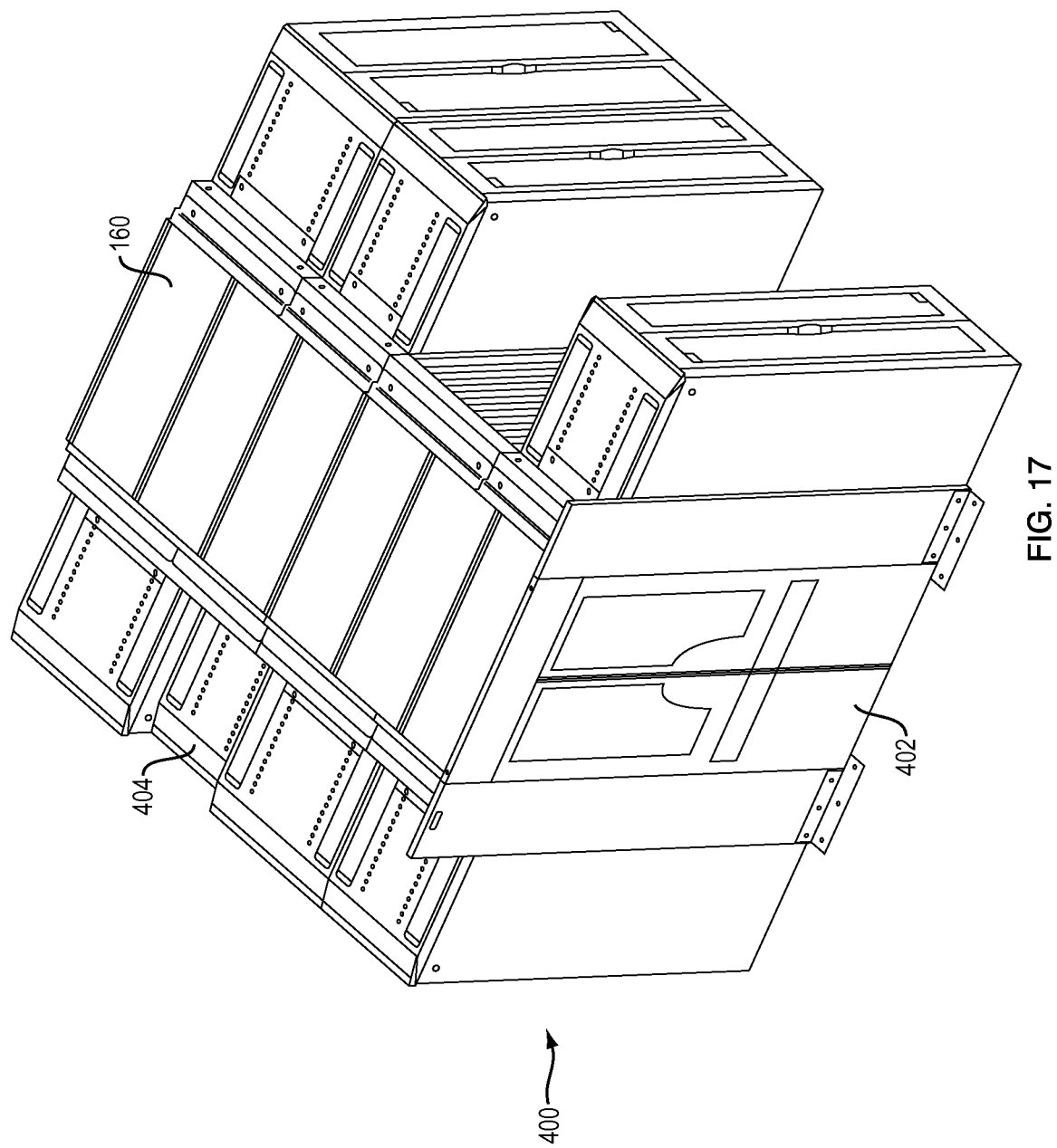
FIGS. 17 and 18 are perspective views of ceiling bracket assemblies and ceiling panels in use with parallel rows of equipment racks and vertical blanking panels, according to additional preferred embodiments of the invention.
Figure 18:
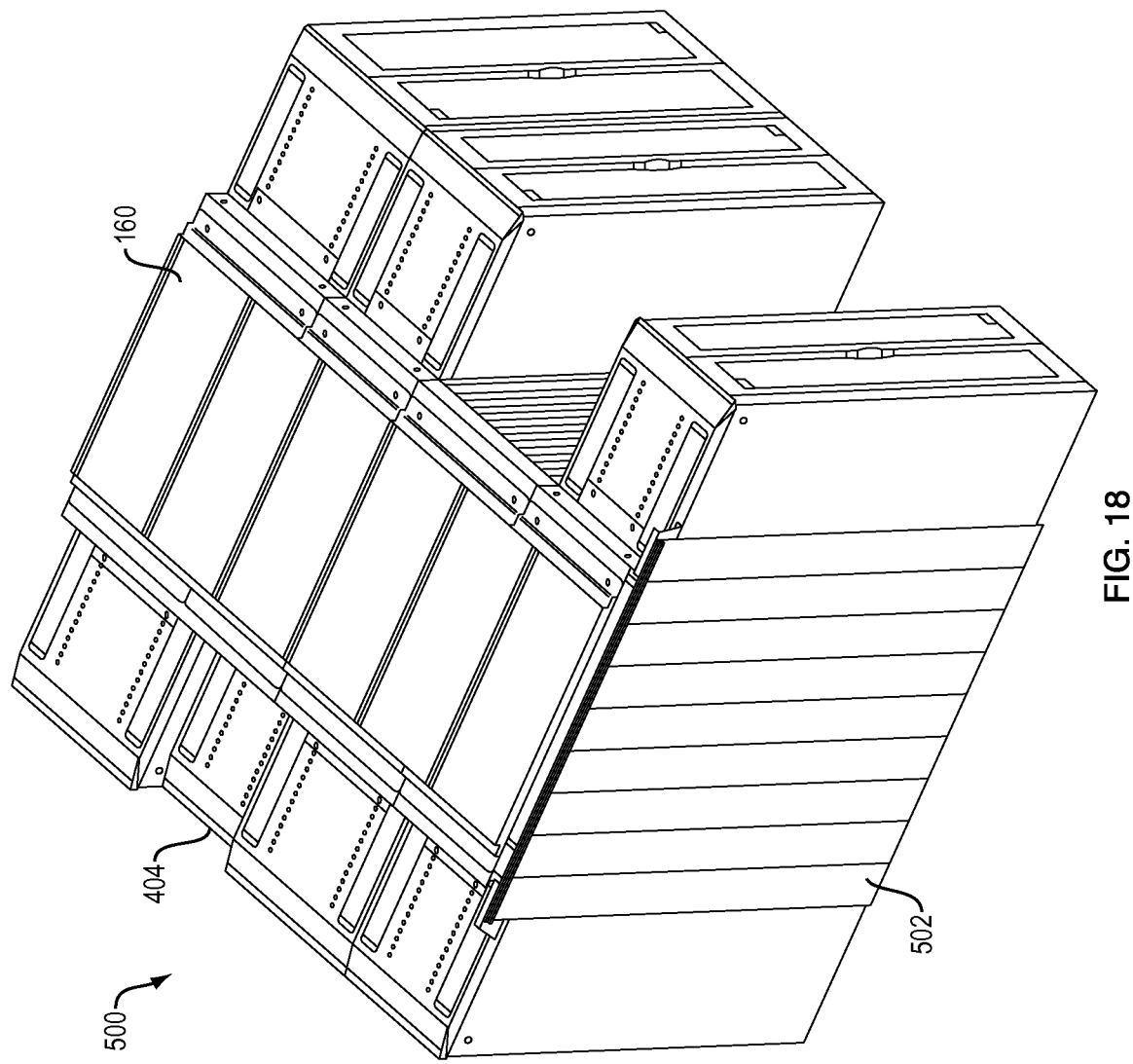

FIGS. 17 and 18 are views of two additional equipment rack and aisle configurations using the inventive aisle enclosure system. With reference to FIG. 17, cold or hot aisle assembly 400 is similar to the assembly shown in FIG. 12, but includes a door assembly 402 that allows access to the contained aisle. Door assembly 402 can carry one or two doors and can be coupled to the floor, coupled to the racks, and/or coupled to ceiling assembly 160. FIG. 18 shows a cold or hot aisle assembly 500 with an additional or alternative end treatment feature, end wall 502, which allows an aisle to be enclosed such that the hot or cold air can be fully contained, to prevent mixing with room air. FIGS. 17 and 18 also show that the inventive aisle enclosure system and the ceiling bracket assemblies can accommodate a rack 404 that is shorter than its adjacent racks, via the vertical adjustability of riser bracket 16 relative to panel support member 12, as described above.

FIGS. 20A-20D illustrate alternative structures and methods for coupling a ceiling assembly to equipment racks. As shown in FIG. 20A and previously described, an integrated mounting channel 710 may be coupled to a ceiling bracket assembly 10s comprising a panel retaining member 14s and a panel support member 12s, which are slidably coupled together by fastener 81s. Panel retaining member 14s and panel support member 12s define a ceiling panel receiving space 82s. Ceiling bracket assembly 10s further defines a mounting flange 112s that defines an upturned distal end flange 119s. Mounting flange 112s can be an integral part of the ceiling bracket assembly, as shown in FIG. 20A, or a separate structure that is coupled to the ceiling bracket assembly, as previously described.

FIG. 20A shows an integrated mounting channel 710, which can be used to mount or support a ceiling assembly on the top of the racks, as shown in FIGS. 20B and 20C, or to suspend a ceiling assembly from an area above the racks, as shown in FIG. 20D. Generally rectangular opening 720 defined between mounting channel 710 and ceiling bracket assembly 10s can accept or be mounted to a rectangular structural member (not shown) that can be used as a mounting location for other devices and structures that need to be mounted to a rack or the aisle, e.g., wiring channels or the like.

With further reference to FIG. 20B, mounting channel 710 is shown coupled to both the ceiling bracket assembly 10s and to the vertical face 736 of bracket 730. The horizontal face 735 of bracket 730 is coupled to the top of a rack. FIG. 20C shows version 10t, with bracket 730 turned around such that horizontal face or flange 735 faces away from opening 82s.

With further reference to FIG. 20D, mounting channel 710 is shown coupled to both the ceiling bracket assembly 10s and to a mounting flange 391s. As previously described, mounting flange 391s supports hangar or threaded rod 380s. Hangar 380s is preferably coupled to a ceiling, a truss or some other portion of the building or room in which the racks are located.

Automatically-Opening Ceiling Panel Assembly

FIGS. 19A and 19B illustrate an alternative arrangement of ceiling panels 600 that are constructed and arranged to automatically move from the normal closed position shown in FIG. 19A, in which the aisle is enclosed, to an open position shown in FIG. 19B, in which the aisle is open to the area above it. One reason for such a construction would be to allow access to the interior of the enclosed aisle in the case of fire, such as to allow a room sprinkler system or non water-based fire suppression system to be effective within the enclosed aisle. In the embodiment shown, this operation is accomplished as follows.

Each ceiling panel, such as panel 79, shown in end view, is carried by an arm 607 to create a ceiling panel assembly 601. FIG. 19A shows identical ceiling panel assemblies 602, 603 and 604. The number of such ceiling panel assemblies, and their widths and lengths, may be configured as desired to enclose an aisle of a particular length and width. The ceiling panel assemblies would be carried by a frame (not shown) that would be locked into place in the ceiling bracket assemblies as do the other ceiling components, such as the ceiling panels and the aisle duct adaptors described above. The frame is configured to accomplish the fixed pivot points described below.

The carriers or arms 607 are pivotally coupled at their lower ends to a moveable structure or bar 610 at pivot point 618. Arms 607 are constructed and further coupled to adjacent fixed structures (e.g., the frame described above) to provide a fixed pivot point 620 for each ceiling panel assembly.

Connector 614 is coupled between its pivot point 634 and arm/bar pivot point 618. Pivot point 618 of ceiling panel assembly is located within slot 615 of connector 614 such that pivot point 618 can slide within slot 615 (e.g., as accomplished by a fastener with a head larger than slot 615). Mechanical, electrical, magnetic or fusable link 630 connects the distal end of connector 614 to a fixed point 632. Extended spring 612 provides a force on bar 610, as shown to the right of FIG. 19A.

Fusable link 630 can be controlled as desired. Typically, it will be tied into an existing fire alarm and suppression system, and be responsive to an alarm condition. When link 630 is ruptured or released, spring 612 pulls moveable structure or bar 610 to the right. The bolt or other fastener at pivot point 618 thus causes connector 614 to pivot about connector/arm pivot point 634, which allows bar 610 to move to the right. A bar movement end point is accomplished when the fastener at pivot point 618 hits the end of slot 615. Since pivot points 620 are fixed, this motion causes ceiling panel assemblies 601-604 to rotate in a counterclockwise fashion such that the ceiling panels, such as panel 79, are moved from a horizontal to a vertical position, as shown in FIG. 19B. As a result, the space between the ceiling panels is now open. A fire retardant can then be passed through the open ceiling into the aisle below.

The particular construction, materials and dimensions described herein are not limitations of the invention, as other constructions can accomplish the invention described herein. For example, many of the components are shown as having the same width as a rack, which is typically 24" or 30", or a metric equivalent, as is known in the field. In order to facilitate component manufacturing, some or all of the components can be made wider. For example, in order to accommodate 8 foot long aisles, the components can be made 8 feet wide, or perhaps 4 feet wide or some other multiple of the standard rack width. Of course the components could also be made less wide than a rack if desired. Also, some assemblies are shown as made from multiple parts coupled together. Such assemblies could be made of more or fewer parts, as constrained by manufacturability and cost issues, which would be apparent to one skilled in the field.

Although specific features of the invention are shown in some figures and not others, this is for convenience only, as features may be combined in other manners, in accordance with the invention.

Recitation ranges of values herein are merely intended to serve as a shorthand method of referring individually to each separate value falling within the range, unless otherwise indicated herein, and each separate value is incorporated into the specification as if it were individually recited herein.

The use of any and all examples, or exemplary language (e.g., "such as") provided herein, is intended merely to better illustrate the invention and does not pose a limitation on the scope of the invention.

A variety of modifications to the embodiments described herein will be apparent to those skilled in the art from the disclosure provided herein. Thus, the invention may be embodied in other specific forms without departing from the spirit or essential attributes thereof.

What is claimed is:

1. An aisle enclosure system for enclosing an aisle defined by two rows of racks, the aisle enclosure system comprising:
    a ceiling structure comprising a plurality of ceiling panels and a plurality of coupling members;
    where the coupling members comprise a panel support member, a panel retainer member and a bracket;
    where the panel support member defines a vertical face and a horizontal support shelf, and the horizontal support shelf supports at least a portion of one of the ceiling panels;
    where the bracket defines a vertical face that is coupled to the vertical face of the panel support member, and the bracket is vertically adjustable relative to the panel support member; and
    where the panel retainer member defines a lower shelf coupled to the horizontal support shelf of the panel support member, and the panel retainer member is horizontally adjustable relative to the panel support member.

2. The aisle enclosure system of claim 1, where the panel retainer member further defines an upper shelf that is positioned above the horizontal support shelf of the panel support member to define a receiving space for at least a portion of one of the ceiling panels.

3. The aisle enclosure system of claim 1, where the ceiling structure further comprises at least one connector member coupled to two panel support members, where the connector member is laterally adjustable relative to the two panel support members.

4. The aisle enclosure system of claim 1, where the ceiling panels define an inwardly-directed flange at one end and an outwardly-directed flange at an opposing end.

5. The aisle enclosure system of claim 4, where an outwardly-directed flange of a first ceiling panel overlies the inwardly-directed flange of a second ceiling panel.

6. The aisle enclosure system of claim 1, further comprising:
    one or more mounting flanges coupled to the coupling members, where the mounting flange defines an upturned distal end; and
    one or more vertical blanking panels, where the vertical blanking panel defines a leg that is configured and adapted to sit on the upturned distal end of the mounting flange, such that the vertical blanking panel can be removably coupled to the mounting flange.

7. The aisle enclosure system of claim 6, where the vertical blanking panel further defines a lower mounting structure proximate an opposing bottom end; and
    where the lower mounting structure is configured and adapted to be removably coupled to a track.

8. The aisle enclosure system of claim 1, further comprising an aisle duct adaptor,
    where the aisle duct adaptor comprises a pair of flanges configured and adapted to couple the aisle duct adaptor to the tops of one or more racks; and
    where the aisle duct adaptor defines a generally rectangular opening defined by opposing lateral walls and opposing end walls, where the opening is configured and adapted to convey air into or out of the aisle.

9. The aisle enclosure system of claim 1 further comprising a plurality of hanger structures, where the hanger structures comprise a threaded rod that defines an upper attachment portion and a lower attachment portion, where the upper attachment portion is configured and adapted to be suspended from an portion above the top of the racks, and where the lower attachment portion is coupled to one of the coupling members.

10. The aisle enclosure system of claim 1, where at least one ceiling panel is pivotably coupled to a moveable structure;
    where the moveable structure is configured and adapted to position the ceiling panel in a closed position, such that the aisle is closed to the area above it, when the moveable structure is in a first position; and
    where the moveable structure is configured and adapted to position the ceiling panel in an open position, such that the aisle is open to the area above it, when the moveable structure is moved to a second position.

11. The aisle enclosure system of claim 10, where the moveable structure is configured and adapted to move from the first position to the second position in response to an alarm condition.

12. An aisle enclosure system for containing an aisle located between two rows of racks, the aisle enclosure system comprising:
    a ceiling structure comprising a plurality of ceiling panels and a plurality of coupling members;
    where at least one of the coupling members comprises a panel support member that supports at least a portion of at least one ceiling panel, a bracket that is configured and adapted to couple the coupling member to the top of a rack, and a panel retainer member coupled to the panel support member;
    where the bracket is vertically adjustable relative to the panel support member; and
    where the panel retainer member is horizontally adjustable relative to the panel support member.

13. The aisle enclosure system of claim 12, where at least two of the ceiling panels overlie one another.

14. The aisle enclosure system of claim 12, further comprising a connector member coupled to two coupling members.

15. The aisle enclosure system of claim 12, further comprising one or more vertical blanking panels coupled to the coupling members.

16. The aisle enclosure system of claim 15, where the vertical blanking panels are further coupled to a track.

17. The aisle enclosure system of claim 12, further comprising an aisle duct adaptor coupled to at least coupling member, where the aisle duct adaptor defines an opening configured and adapted to convey air into or out of the aisle.

18. The aisle enclosure system of claim 12, further comprising a plurality of hanger structures coupled to the coupling members, where the hanger structures are configured and adapted to be suspended from an area above the racks.

19. The aisle enclosure system of claim 12, further comprising a structure coupled to at least one ceiling panel;
    where the structure is configured and adapted to position the ceiling panel in a closed position when the structure is in a first position, such that the aisle is closed to the area above it, and position the at least one ceiling panel in an open position, such that the aisle is open to the area above it, when the structure is move to a second position.

20. An aisle enclosure system for enclosing an aisle defined by two rows of racks, the aisle enclosure system comprising:
    a ceiling structure comprising a plurality of ceiling panels that adjoin one another along lateral sides thereof, and a one or more coupling members;
    wherein the ceiling panels are constructed and arranged to overlap one another along adjoining lateral sides, and once overlapped are adapted to be moved together and apart, to alter the length of the aisle that is covered by the adjoined ceiling panels; and
    wherein the coupling members comprise a ceiling panel support shelf on which a ceiling panel is engaged, and a member that is vertically adjustable in length, to alter the spacing between the ceiling panels and the top of a rack.

* * * * *